(12) United States Patent
Kawasaki

(10) Patent No.: US 10,302,708 B2
(45) Date of Patent: May 28, 2019

(54) INTEGRATED CURRENT VALUE MEASURING DEVICE, REMAINING BATTERY LEVEL MEASURING DEVICE, ELECTRONIC DEVICE, INTEGRATED CURRENT VALUE MEASURING METHOD, AND INFORMATION COLLECTING SYSTEM

(71) Applicant: FUJITSU LIMITED, Kawasaki-shi, Kanagawa (JP)

(72) Inventor: Kenichi Kawasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 99 days.

(21) Appl. No.: 15/711,227

(22) Filed: Sep. 21, 2017

(65) Prior Publication Data
US 2018/0095135 A1   Apr. 5, 2018

(30) Foreign Application Priority Data
Oct. 4, 2016   (JP) .................. 2016-196591

(51) Int. Cl.
*G01R 31/36*   (2019.01)
*G01R 31/3828*   (2019.01)
*G01R 31/392*   (2019.01)
*H01M 2/34*   (2006.01)
*H01M 10/48*   (2006.01)
*H01M 10/42*   (2006.01)

(52) U.S. Cl.
CPC ....... *G01R 31/3828* (2019.01); *G01R 31/392* (2019.01); *H01M 2/348* (2013.01); *H01M 10/48* (2013.01); *H01M 10/486* (2013.01); *H01M 2010/4278* (2013.01)

(58) Field of Classification Search
CPC ............... G01R 31/26; G01R 31/2642; G01R 31/2648; G01R 31/2831; G01R 31/31702; G01R 31/40; G01R 31/42
See application file for complete search history.

(56) References Cited

U.S. PATENT DOCUMENTS

| | | | | |
|---|---|---|---|---|
| 6,167,349 | A * | 12/2000 | Alvarez | G01R 31/3648 702/63 |
| 2014/0203762 | A1* | 7/2014 | Kato | H02J 7/0031 320/107 |
| 2015/0219721 | A1* | 8/2015 | Yang | H02J 7/0021 324/437 |

FOREIGN PATENT DOCUMENTS

| | | |
|---|---|---|
| JP | 08-278837 | 10/1996 |
| JP | 2002-286820 | 10/2002 |

* cited by examiner

*Primary Examiner* — Tung X Nguyen
(74) *Attorney, Agent, or Firm* — Fujitsu Patent Center

(57) ABSTRACT

An integrated current value measuring device includes a first element having a resistance value that changes in accordance with an integrated value of current flowing in the first element, a second element having a resistance value that changes in accordance with an integrated value of current flowing in the second element, and having a degree of the change in the resistance value that is smaller than that of the change in the resistance value of the first element, and an integrated value calculator configured to calculate an integrated current value based on the resistance value of the first element and the resistance value of the second element, the integrated current value being an integrated amount of current flowing in a current path in which the first element and the second element are inserted in series.

16 Claims, 37 Drawing Sheets

FIG.18

| INPUT DIFFERENTIAL POTENTIAL $\Delta V$ [mV] (POTENTIAL OF + TERMINAL WITH RESPECT TO − TERMINAL) | ANALOG OUTPUT VALUE [mV] |
|---|---|
| −50 | 0 |
| −40 | 100 |
| −30 | 200 |
| −20 | 300 |
| −10 | 400 |
| 0 | 500 |
| +10 | 600 |
| +20 | 700 |
| +30 | 800 |
| +40 | 900 |
| +50 | 1000 |

FIG.19

| INPUT VOLTAGE [mV] | DIGITAL OUTPUT VALUE |
|---|---|
| −0.5〜0.5 | −500 |
| 0.5〜1.5 | −499 |
| ... | ... |
| 497.5〜498.5 | −2 |
| 498.5〜499.5 | −1 |
| 499.5〜500.5 | 0 |
| 500.5〜501.5 | +1 |
| 501.5〜502.5 | +2 |
| ... | ... |
| 998.5〜999.5 | +499 |
| 999.5〜1000.5 | +500 |

| LUT AFTER EVEN-NUMBERED INSTANCE OF BATTERY REPLACEMENT | | |
|---|---|---|
| RATIO: $\Delta V1/\Delta V0$ | INTEGRATED CURRENT VALUE [mAh] | REMAINING BATTERY LEVEL [mAh] |
| 1.000~1.001 | 0 | 1000 |
| 1.001~1.002 | 10 | 990 |
| 1.002~1.003 | 20 | 980 |
| 1.003~1.004 | 30 | 970 |
| ... | ... | ... |
| 1.099~1.100 | 990 | 10 |
| 1.100~1.101 | 1000 | 0 |

| LUT AFTER ODD-NUMBERED INSTANCE OF BATTERY REPLACEMENT | | |
|---|---|---|
| RATIO: $\Delta V1/\Delta V0$ | INTEGRATED CURRENT VALUE [mAh] | REMAINING BATTERY LEVEL [mAh] |
| 1.000~1.001 | 1000 | 0 |
| 1.001~1.002 | 990 | 10 |
| 1.002~1.003 | 980 | 20 |
| 1.003~1.004 | 970 | 30 |
| ... | ... | ... |
| 1.099~1.100 | 10 | 990 |
| 1.100~1.101 | 0 | 1000 |

CHARGING DIRECTION

| RATIO: $\Delta V1/\Delta V0$ | LUT AT BATTERY CHARGING | |
| --- | --- | --- |
| | HIGH-TEMPERATURE INTEGRATED CURRENT VALUE [mAh] | LOW-TEMPERATURE INTEGRATED CURRENT VALUE [mAh] |
| 1.000~1.001 | 0 | 0 |
| 1.001~1.002 | 10 | 12 |
| 1.002~1.003 | 20 | 24 |
| ... | ... | ... |
| 1.083~1.084 | 830 | 996 |
| 1.084~1.085 | 840 | 1008 |
| 1.085~1.086 | 850 | – |
| ... | ... | ... |
| 1.099~1.100 | 990 | – |
| 1.100~1.101 | 1000 | – |

| LUT AT BATTERY DISCHARGING | | |
|---|---|---|
| RATIO: $\Delta V1/\Delta V0$ | HIGH-TEMPERATURE INTEGRATED CURRENT VALUE [mAh] | LOW-TEMPERATURE INTEGRATED CURRENT VALUE [mAh] |
| 1.000~1.001 | 1000 | 1008 |
| 1.001~1.002 | 990 | 996 |
| 1.002~1.003 | 980 | 984 |
| ... | ... | ... |
| 1.083~1.084 | 170 | 12 |
| 1.084~1.085 | 160 | 0 |
| 1.085~1.086 | 150 | – |
| ... | ... | ... |
| 1.099~1.100 | 10 | – |
| 1.100~1.101 | 0 | – |

DISCHARGING DIRECTION

| LUT AT BATTERY CHARGING |||
| --- | --- | --- |
| RATIO: $\Delta V1/\Delta V0$ | PRE-DETERIORATION INTEGRATED CURRENT VALUE [mAh] | POST-DETERIORATION INTEGRATED CURRENT VALUE [mAh] |
| 1.000~1.001 | 0 | – |
| 1.001~1.002 | 10 | – |
| 1.002~1.003 | 20 | – |
| ... | ... | ... |
| 1.020~1.021 | 200 | 0 |
| 1.021~1.022 | 210 | 10 |
| 1.022~1.023 | 220 | 20 |
| ... | ... | ... |
| 1.099~1.100 | 990 | 790 |
| 1.100~1.101 | 1000 | 800 |
| 1.101~1.102 | – | 810 |
| ... | ... | ... |
| 1.119~1.120 | – | 990 |
| 1.120~1.121 | – | 1000 |

CHARGING DIRECTION

| LUT AT BATTERY DISCHARGING ||| 
| RATIO: $\Delta V1/\Delta V0$ | PRE-DETERIORATION INTEGRATED CURRENT VALUE [mAh] | POST-DETERIORATION INTEGRATED CURRENT VALUE [mAh] |
|---|---|---|
| 1.000~1.001 | 1000 | – |
| 1.001~1.002 | 990 | – |
| 1.002~1.003 | 980 | – |
| ... | ... | ... |
| 1.020~1.021 | 800 | 1000 |
| 1.021~1.022 | 790 | 990 |
| 1.022~1.023 | 780 | 980 |
| ... | ... | ... |
| 1.099~1.100 | 10 | 210 |
| 1.100~1.101 | 0 | 200 |
| 1.101~1.102 | – | 190 |
| ... | ... | ... |
| 1.119~1.120 | – | 10 |
| 1.120~1.121 | – | 0 |

DISCHARGING DIRECTION ↑

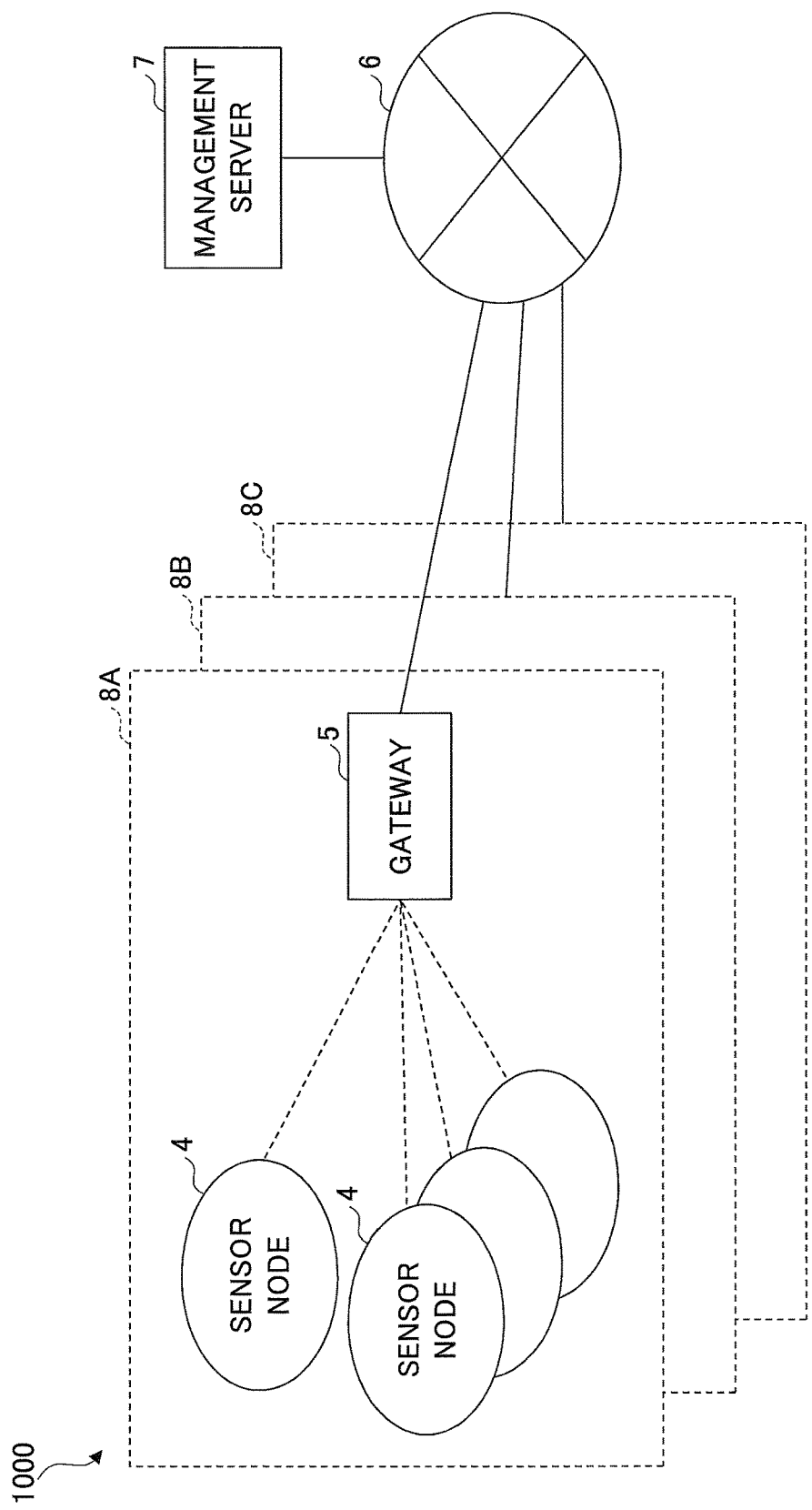

INTEGRATED CURRENT VALUE MEASURING DEVICE, REMAINING BATTERY LEVEL MEASURING DEVICE, ELECTRONIC DEVICE, INTEGRATED CURRENT VALUE MEASURING METHOD, AND INFORMATION COLLECTING SYSTEM

CROSS-REFERENCE TO RELATED APPLICATION

This patent application is based upon, and claims the benefit of priority of Japanese Patent Application No. 2016-196591 filed on Oct. 4, 2016, the entire contents of which are incorporated herein by reference.

FIELD

The embodiments discussed herein relate to an integrated current value measuring device, a remaining battery level measuring device, an electronic device, an integrated current value measuring method, and an information collecting system.

BACKGROUND

There is known in a related art a technology of integrating a current flowing through a resistor connected in series to a battery to calculate a remaining battery level (see, e.g., Patent Document 1).

RELATED ART DOCUMENT

Patent Document

Patent Document 1: Japanese Laid-open Patent Publication No. 8-278837

Continuously measuring current with a measuring circuit in order to calculate the integrated value of current increases the consumption current of the measuring circuit itself, which will lower the remaining battery level. However, when the measuring circuit is operated intermittently to reduce the current consumption of the measuring circuit, the measuring circuit will not accurately detect a change of the current to calculate the integrated value of the current accurately.

SUMMARY

According to an aspect of embodiments, an integrated current value measuring device includes a first element having a resistance value that changes in accordance with an integrated value of current flowing in the first element; a second element having a resistance value that changes in accordance with an integrated value of current flowing in the second element, and having a degree of the change in the resistance value that is smaller than that of the change in the resistance value of the first element; and an integrated value calculator configured to calculate an integrated current value based on the resistance value of the first element and the resistance value of the second element, the integrated current value being an integrated amount of current flowing in a current path in which the first element and the second element are inserted in series.

The object and advantages of the invention will be realized and attained by means of the elements and combinations particularly pointed out in the appended claims.

It is to be understood that both the foregoing general description and the following detailed description are exemplary and explanatory and are not restrictive of the invention.

Additional objects and advantages of the embodiments will be set forth in part in the description which follows, and in part will be obvious from the description, or may be learned by practice of the invention.

BRIEF DESCRIPTION OF THE DRAWINGS

FIG. 18 is a diagram illustrating an example of an input-output relationship of an amplifier;

FIG. 19 is a diagram illustrating an example of an input-output relation of an ADC;

FIG. 39 is a diagram illustrating an example of a configuration of an information collection system.

DESCRIPTION OF EMBODIMENTS

Accordingly, one aspect of an embodiment of the present disclosure is to accurately calculate the integrated value of current.

The following describes embodiments of the present disclosure with reference to the accompanying drawings.

Figure 1:
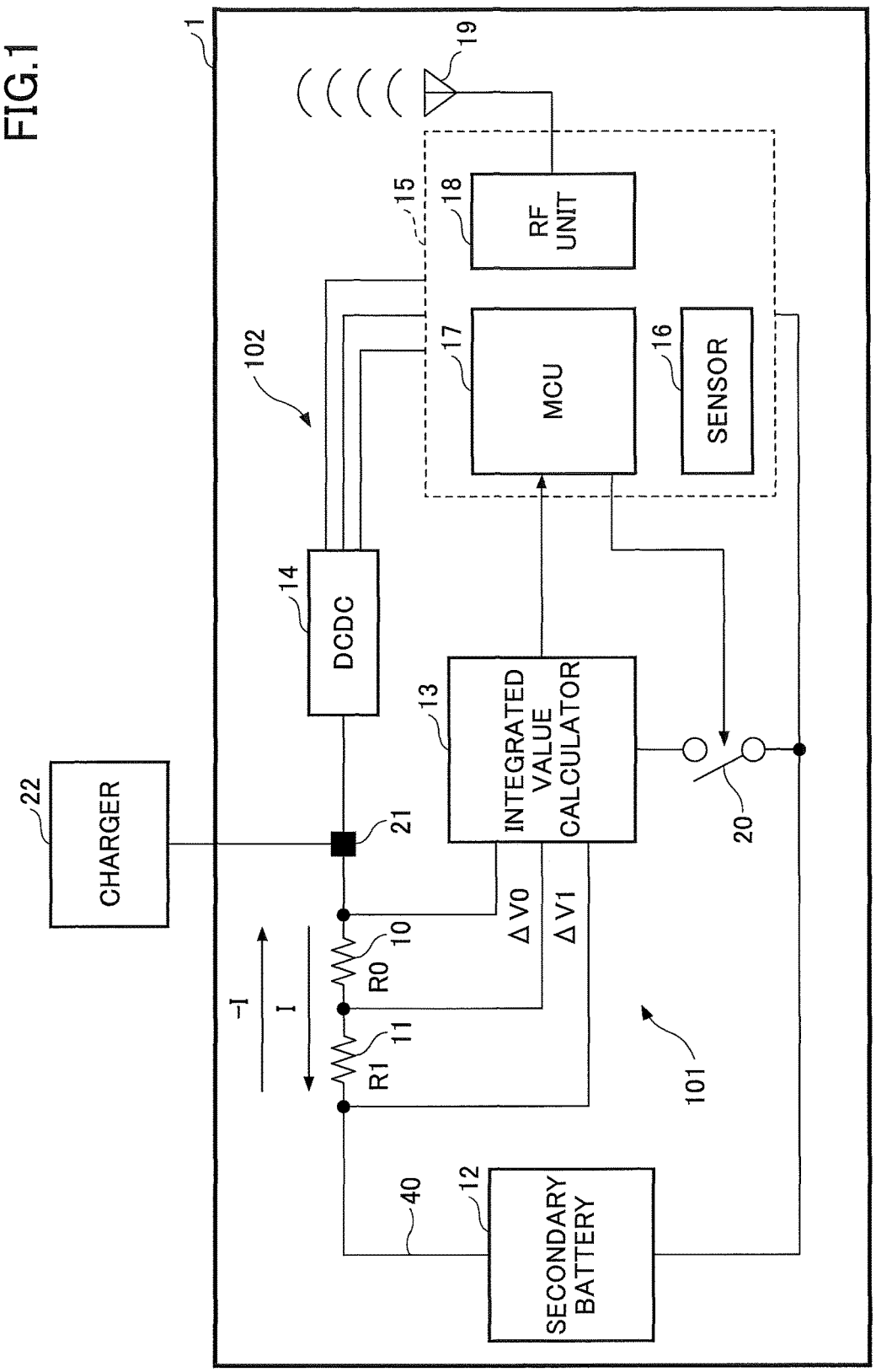
FIG. 1 is a diagram illustrating an example of a configuration of an electronic device according to a first embodiment.

FIG. 1 is a diagram illustrating an example of a configuration of an electronic device according to a first embodiment. An electronic device 1 illustrated in FIG. 1 is an example of a device that uses a secondary battery 12 as a power source. Specific examples of the electronic device 1 include a mobile phone, a smartphone, a tablet computer, a wearable device, and the like. The electronic device 1 may be an IoT (Internet of Things) device such as a sensor node. Specific examples of the electronic device 1 are not limited to these examples.

The sensor nodes are multiple devices arranged in a wide area in order to acquire observation data such as environmental data. The sensor nodes may be driven by electric power supplied from a battery installed in each sensor node for a location where it is difficult to secure external power supply. In such a battery-powered device, in order to detect timing of charging or replacement of the battery with high accuracy, it is important to measure the remaining battery level with high accuracy, in terms of operation management.

FIG. 39 is a diagram illustrating an example of a configuration of an information collection system. The information collection system 1000 illustrated in FIG. 39 includes two or more sensor nodes 4, a gateway 5, and a management server 7. The management server 7 is an example of an information processing apparatus configured to process information collected from each of the sensor nodes 4. The management server 7 collects a remaining battery level measured by each sensor node 4, from a corresponding sensor node 4 via the gateway 5 and the network 6, and uses the remaining battery level collected from each sensor node 4 to manage the remaining battery level of the corresponding sensor node 4. As a result, even when the sensor nodes 4 are dispersed over a wide area, the management server 7 is enabled to perform remote management such as monitoring a change with time in the remaining battery level of each sensor node 4.

Specific examples of observation data detected by the sensor node 4 include temperature, humidity, precipitation (rainfall) amount, water level, voltage, current, electric power, electric energy, pressure, communication volume (traffic), light intensity, and the like. Observation data is not limited to these examples.

Note that the management server 7 may directly collect the observation data detected by the sensor node 4 and the remaining level data of the battery mounted on the sensor node 4, from the sensor node 4 without passing through the gateway 5.

In FIG. 1, an electronic device 1 includes a secondary battery 12, a DCDC converter 14, an integrated value calculator 13, a signal processor 15, and an antenna 19.

The secondary battery 12 is an example of a chargeable-dischargeable battery. The secondary battery 12 is enabled to be charged by the charger 22. Specific examples of the secondary battery 12 include a lithium ion battery and a lithium polymer battery.

The DCDC converter 14 step-down converts DC power of the secondary battery 12, and supplies DC power obtained by step-down conversion to the signal processor 15 and to the integrated value calculator 13.

The integrated value calculator 13 calculates an integrated value (hereinafter referred to as "integrated current value A") of the current I flowing through the current path 40 to which the secondary battery 12 is connected. Details of the calculation of the integrated current value A will be described later.

The signal processor 15 is an example of a processor configured to calculate the remaining battery level of the secondary battery 12 based on the integrated current value A calculated by the integrated value calculator 13 and to perform a predetermined process using the calculated remaining battery level of the secondary battery 12. The signal processor 15 includes, for example, a sensor 16, an MCU (Micro Controller Unit) 17, and an RF (Radio Filter) unit 18.

The sensor 16 detects predetermined observation data. The MCU 17 includes a CPU (Central Processing Unit), a ROM (Read Only Memory), a RAM (Random Access Memory), and the like, and performs operations and the like. The RF unit 18 performs modulation processing and demodulation processing.

For example, in a case of the electronic device 1 being a sensor node 4 (see FIG. 39), the sensor 16 detects environmental data such as temperature. The MCU 17 acquires the environmental data detected by the sensor 16. When an environment data transmission request signal received by the antenna 19 is input via the RF unit 18, the MCU 17 transmits the environmental data, which is acquired from the sensor 16, from the antenna 19 via the RF unit 18. Accordingly, the management server 7 (e.g., a cloud server) installed at a location distant from the sensor nodes 4 is enabled to collect the environmental data detected by the sensor nodes 4 arranged at various locations by transmitting the environmental data transmission request signal to the MCU 17.

In FIG. 1, an electronic device 1 includes a remaining battery level measuring device 102. The remaining battery level measuring device 102 measures a remaining battery level of the secondary battery 12. The remaining battery level measuring device 102 may include an integrated current value measuring device 101 and the MCU 17. The integrated current value measuring device 101 includes an integrated value calculator 13 for calculating the integrated current value A. The MCU 17 is an example of a remaining battery level calculator that calculates a remaining battery level of the secondary battery 12 based on the integrated current value A calculated by the integrated value calculator 13.

For example, when the electronic device 1 is the sensor node 4 (see FIG. 39), and a remaining battery level data transmission request signal received by the antenna 19 is input via the RF unit 18, the MCU 17 transmits the calculated remaining battery level data of the secondary battery 12 from the antenna 19 via the RF unit 18. Accordingly, the management server 7 (e.g., a cloud server) installed at a location distant from the sensor nodes 4 is enabled to collect the environmental data detected by the sensor nodes 4 arranged at various locations by transmitting the environmental data transmission request signal to the MCU 17. The MCU 17 calculates a charging time or a replacement time of the secondary battery 12 based on the calculated remaining battery level of the secondary battery 12, and may transmit from the antenna 19 a signal reporting the charging time or the replacement time of the secondary battery 12, or a signal reporting that the charging time or replacement time is approaching or is expired.

The management server 7 changes the frequency of collecting information from each of the sensor nodes 4 (i.e., the frequency at which each of the sensor nodes 4 transmits information) according to the remaining battery level data collected from a corresponding one of the sensor nodes 4. The sensor node 4 uses the power of the battery installed in the sensor node 4 itself for transmitting information. Hence, the management server 7 is enabled to remotely adjust the remaining battery level of each of the sensor nodes 4 by changing the frequency of collecting information from the corresponding one of the sensor nodes 4. The management server 7 is enabled to change the frequency of collecting information from each of the sensor nodes 4 by changing the frequency of transmitting the data transmission request signal such as the environmental data transmission request signal.

For example, the management server 7 changes, for each area, the frequency with which the sensor node 4 transmits information, such that the remaining battery levels of the sensor nodes 4 within the same area are the same. Accordingly, since depletion times of the remaining battery levels of the sensor nodes 4 are all the same within the same area, charging or replacement of the battery in the sensor nodes 4 may be performed at the same time for each area, thereby lowing the operation management cost. FIG. 39 illustrates an embodiment in which multiple sensor nodes 4 and gateways 5 are arranged in each of the areas 8A, 8B, and 8C.

For example, the management server 7 reduces the frequency with which the observation data is collected from the sensor nodes 4 having remaining battery level data smaller than a reference value, to be lower than the frequency with which the observation data is collected from the sensor nodes 4 having remaining battery level data greater than the reference value, within the same area. Alternatively, the management server 7 raises the frequency with which the observation data is collected from the sensor nodes 4 having remaining battery level data greater than a reference value, to be greater than the frequency with which the observation data is collected from the sensor nodes 4 having remaining battery level data lower than the reference value, within the same area.

The management server 7 transmits a data transmission request signal to the gateway 5 within each area via the network 6. The gateway 5 within each area acquires information from each of the sensor nodes 4 in the same area as the gateway 5 itself and uploads the acquired information to the management server 7 via the network 6.

The transmission and reception of information between the sensor node 4 and the gateway 5 is performed by near field wireless communication; however, the transmission and reception of information between the sensor node 4 and the gateway 5 may also be performed by wired communication. The transmission and reception of information between the gateway 5 and the network 6 is performed by wired communication; however, the transmission and reception of information between the gateway 5 and the network 6 may also be performed by wireless communication. Further, the gateway 5 that manages each sensor network may have a part of the management function of the management server 7, and the information collection system 1000 may be configured to be a distributed management system.

Further, for example, in FIG. 1, when the electronic device 1 is a mobile terminal device such as a mobile phone, the MCU 17 may perform a process of displaying the calculated remaining battery level data of the secondary battery 12 on the display.

The integrated current value measuring device 101 includes an element 11, an element 10, an integrated value calculator 13, and a cutoff switch 20.

The element 11 has a first resistance characteristic in which the resistance value changes in accordance with the integrated value of the current flowing in the element 11 itself. The element 11 is an example of a first element. The element 10 has a second resistance characteristic in which the degree of change in the resistance value according to the integrated value of the current flowing in the element 10 itself is smaller than that of the element 11. The element 10 is an example of a second element. The element 11 and the element 10 are connected in series. The insertion positions of the element 11 and the element 10 may be switched with each other.

Figure 2:
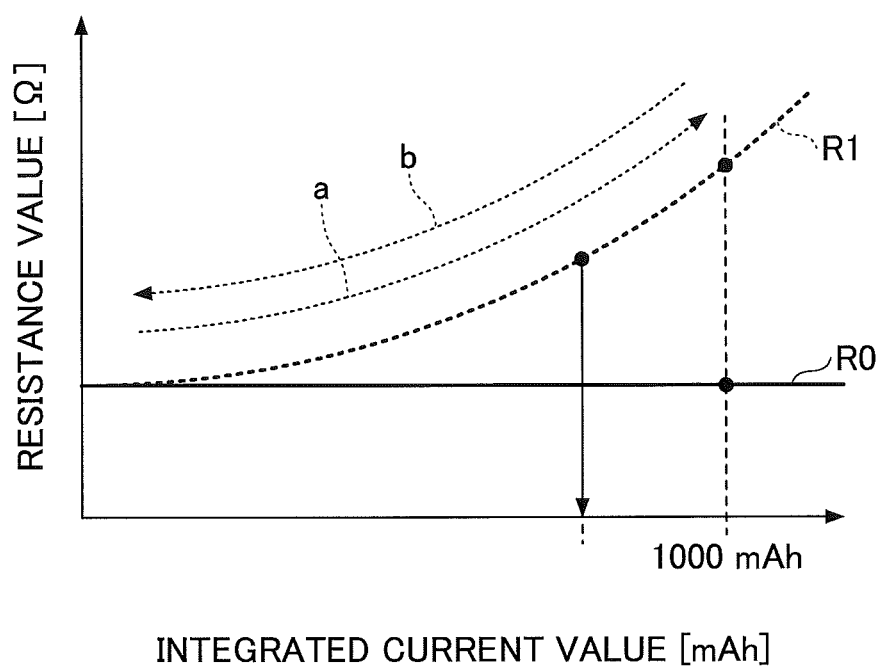
FIG. 2 is a diagram illustrating an example of a relationship between an integrated current value and a resistance value.

FIG. 2 is a diagram illustrating an example of a relationship between an integrated current value and a resistance value. FIG. 2 illustrates, as an example of the first resistance characteristic of the element 11, a characteristic that a resistance value R1 of the element 11 increases as the integrated value of the current flowing in the element 11 increases. In addition, FIG. 2 illustrates, as an example of the second resistance characteristic of the element 10, a characteristic in which a resistance value R0 of the element 10 barely changes even though the integrated value of the current flowing in the element 10 itself increases.

In FIG. 1, the integrated value calculator 13 measures the voltage $\Delta V1$ occurring in the element 11 and the voltage $\Delta V0$ occurring in the element 10, and calculates an integrated current value (integrated current value A) of the current I flowing through the current path 40. The voltage $\Delta V1$ is an example of the first voltage and represents a potential difference between two ends of the element 11. The voltage $\Delta V1$ is an example of the second voltage and represents a potential difference between two ends of the element 10. Since the element 10 and the element 11 are inserted in series in the current path 40, the current I flowing in the current path 40 also flows in the elements 10 and 11.

The integrated value calculator 13 calculates an integrated current value A corresponding to the measured value of the voltage $\Delta V1$ and the measured value of the voltage $\Delta V0$, based on a relational rule representing a relationship between the voltage $\Delta V1$, the voltage $\Delta V0$ and the integrated current value A.

For example, $$I = \Delta V0/R0 \quad \text{(Formula 1)}$$

$$R1 = \Delta V1/I \quad \text{(Formula 2)}$$

It is assumed that the above-described relationship is established.

$$R1 = (\Delta V1/\Delta V0) \times R0 \quad \text{(Formula 3)}$$

According to Formulas 1 and 2, the relationships of Formula 3 are established.

The integrated value calculator 13 is enabled to calculate the current resistance value R1 by substituting the measured value of the voltage $\Delta V1$, the measured value of the voltage $\Delta V0$, and the resistance value R0 of the element 10 into the Formula 3. In the Formula 3, the resistance value R0 is assumed to a constant value (see FIG. 2). Further, the integrated current value A is assumed to be equal to the integrated value of the current I flowing in the element 11. Accordingly, based on the relationship (see FIG. 2) between the integrated current value A and the resistance value R1, the integrated value calculator 13 is enabled to accurately calculate the integrated current value A at a given time corresponding to the calculated current resistance value R1. Further, based on the integrated current value A at the given time calculated by the integrated value calculator 13, the MCU 17 is enabled to accurately calculate the remaining battery level of the secondary battery 12 at the given time.

Further, in FIG. 2, the resistance value R1 on the vertical axis may be replaced with a resistance ratio (R1/R0). According to modification of Formulas 3, the relationship of Formula 4 is established.

$$R1/R0 = \Delta V1/\Delta V0 \quad \text{(Formula 4)}$$

The integrated value calculator 13 is enabled to calculate the resistance ratio (R1/R0) at the given time by substituting the measured value of the voltage $\Delta V1$ and the measured value of the voltage $\Delta V0$ into the Formula 4. Accordingly, based on the relationship between the integrated current value A and the resistance ratio (R1/R0), the integrated value calculator 13 is enabled to accurately calculate the integrated current value A at the given time corresponding to the calculated resistance ratio (R1/R0) at the given time. Further, based on the integrated current value A at the given time calculated by the integrated value calculator 13, the MCU 17 is enabled to accurately calculate the remaining battery level of the secondary battery 12 at the given time.

In a case where it is not necessary to calculate the integrated current value A or the remaining battery level of the secondary battery 12, the MCU 17 operates the cutoff switch 20 such that power supply to the integrated value calculator 13 is cut off by the cutoff switch 20. In contrast, in a case where it is necessary to calculate the integrated current value A or the remaining battery level of the secondary battery 12, the MCU 17 operates the cutoff switch 20 such that the cutoff switch 20 terminates the cutoff of power supply to the integrated value calculator 13. As described above, by operating the integrated value calculator 13 whenever necessary to obtain the calculation result of the integrated current value A, it is possible to control the power consumption necessary both for measuring the current I and for calculating the integrated current value A. The cutoff switch 20 is an example of a cutoff unit.

Figure 3:
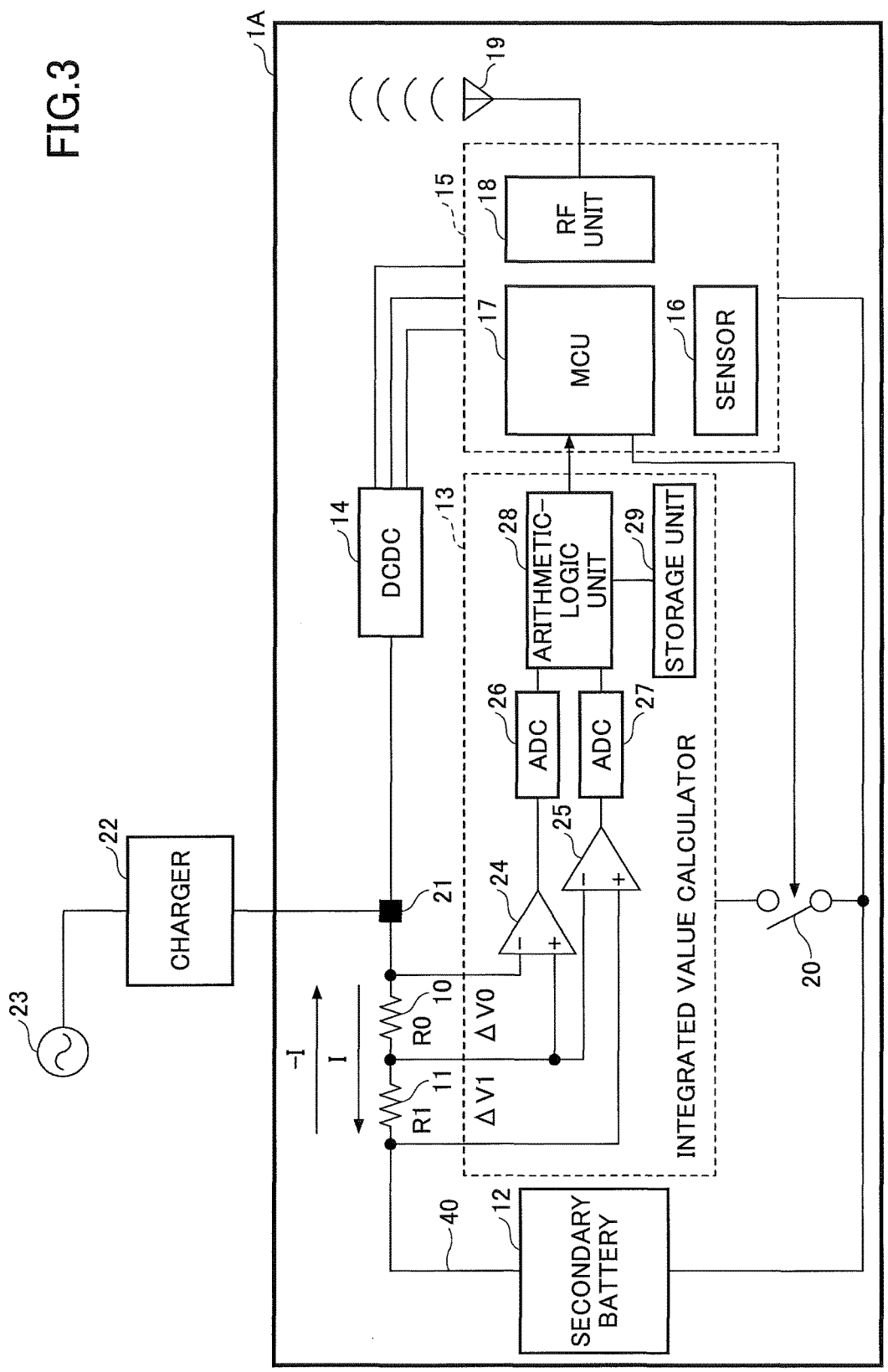
FIG. 3 is a diagram illustrating a first specific example of the configuration of the electronic device according to the first embodiment.

FIG. 3 is a diagram illustrating a first specific example of the configuration of the electronic device according to the first embodiment. An electronic device 1A illustrated in FIG. 3 is an example of the electronic device 1 illustrated in FIG. 1.

For example, the element 11 is an element having a resistance value varying with electromigration (a device relatively weak against electromigration). By contrast, the element 10 is an element having a resistance value barely varying with electromigration (a device relatively strong against electromigration).

Electromigration is the rise of a wiring resistance value occurring as a current continues to flow through a metal wiring, whereby electrons continue to collide with metal atoms, causing metal atoms to migrate within the wiring to result in divergence from the atomic arrangement. There are devices with high resistance increase rate (relatively weak against electromigration) and devices with little change in resistance value (relatively strong against electromigration) even with the same integrated current value, depending on the wiring materials. Electromigration has a reversibility such that the resistance value returns to its original value when the direction of the current is reversed. That is, a device that is relatively weak against electromigration may be a nonvolatile memory that stores the integrated value of current including a positive or negative current direction. By measuring the resistance value of an element which is relatively weak against electromigration, it becomes possible to obtain the integrated value of the current that have been flowing in the element up until measuring the resistance value of the element.

Specific examples of an element relatively weak against electromigration include an element having Al (aluminum) sandwiched between upper and lower TiN (titanium nitride), a magnetic tunnel junction (MTJ) element, and a variable resistance element having tantalum oxide sandwiched between an upper electrode and a lower electrode. Specific examples of an element relatively strong against electromigration include chip resistors and the like made of Ni—Cu (copper nickel based alloy), Ni—Cr (nickel chromium based alloy), and Cu—Mn (copper manganese based alloy).

The feature of an element relatively weak against electromigration may indicate that the resistance value varies with respect to the integrated current value including positive and negative directions of the flowing current, as illustrated in FIG. 2. In order to utilize this feature, the charger 22 is connected at the location illustrated in FIG. 3 such that the direction of the current at the time of battery charging and at the time of battery consumption (at the time of battery discharging) are reversed. Accordingly, a feature is obtained whereby the resistance value R1 increased by the integrated current value at the time of charging the battery is offset by the integrated current value at the time of battery consumption, and returns to the original value. Hence, it is possible to calculate the integrated current value any number of times.

For example, in FIG. 2, when the uncharged secondary battery 12 is charged by the charger 22 in a state of the uncharged secondary battery 12 being connected to the current path 40, the resistance value R1 increases as the integrated value of the current I in the direction of charging the secondary battery 12 increases (see an arrow "a" in FIG. 2). Then, when the fully charged secondary battery 12 is discharged after being charged in the direction in which the resistance value R1 increases, the resistance value R1 decreases as the integrated value of the current I in the direction of discharging the secondary battery 12 increases (see an arrow "b" in FIG. 2).

Alternatively, for example, in FIG. 2, when the fully charged secondary battery 12 is discharged in a state of the fully charged secondary battery 12 being connected to the current path 40, the resistance value R1 increases as the integrated value of the current I in the direction of discharging the secondary battery 12 increases (see the arrow "a" in FIG. 2). Then, when the secondary battery 12, which is discharged in the direction in which the resistance value R1 increases, is charged by the charger 22, the resistance value R1 decreases as the integrated value of the current I in the direction of discharging the secondary battery 12 increases (see the arrow b FIG. 2).

FIG. 3 illustrates a connection point 21 where the charger 22 for charging the secondary battery 12 is connected to the current path 40. The charger 22 generates electric power to be charged in the secondary battery 12, for example, based on AC power supplied from an AC power integrated value. The charger 22 may be a harvester that generates electricity by absorbing environmental energy such as sunlight, vibration, or heat.

The connection point 21 is located at an opposite side to the secondary battery 12 with respect to insertion positions of the elements 10 and 11. The direction of the current I may be reversed between charging the secondary battery 12 and discharging the secondary battery 12 by locating the connection point 21 at such a location.

The integrated value calculator 13 includes amplifiers 24 and 25, AD (analog-to-digital) converters (ADC) 26 and 27, an arithmetic-logic unit 28, and a storage unit 29.

The amplifier 25 amplifies a voltage $\Delta V1$ generated in the element 11. The ADC 27 converts the voltage $\Delta V1$ amplified by the amplifier 25 to a digital value and outputs a digital measured value of the voltage $\Delta V1$. The amplifier 24 amplifies a voltage $\Delta V0$ generated in the element 10. The ADC 26 converts the voltage $\Delta V0$ amplified by the amplifier 24 to a digital value and outputs a digital measured value of the voltage $\Delta V0$.

The storage unit 29 stores correspondence information indicating a relationship between the integrated current value A and the resistance value R1. For example, a lookup table (LUT) representing correspondence information defining the resistance characteristics illustrated in FIG. 2 is stored in the storage unit 29. The resistance characteristics illustrated in FIG. 2 may be generated, for example, by acquiring data in advance through experiments or the like.

The arithmetic-logic unit 28 has, for example, a division circuit. The arithmetic-logic unit 28 calculates the resistance value R1 defined by the above formula 3 by the dividing circuit, using the digital measured value of the voltage $\Delta V1$, the digital measured value of the voltage $\Delta V0$, and the resistance value R0. The arithmetic-logic unit 28 refers to the correspondence information stored in the storage unit 29 and calculates an integrated current value A corresponding to the calculated resistance value R1.

Figure 4:
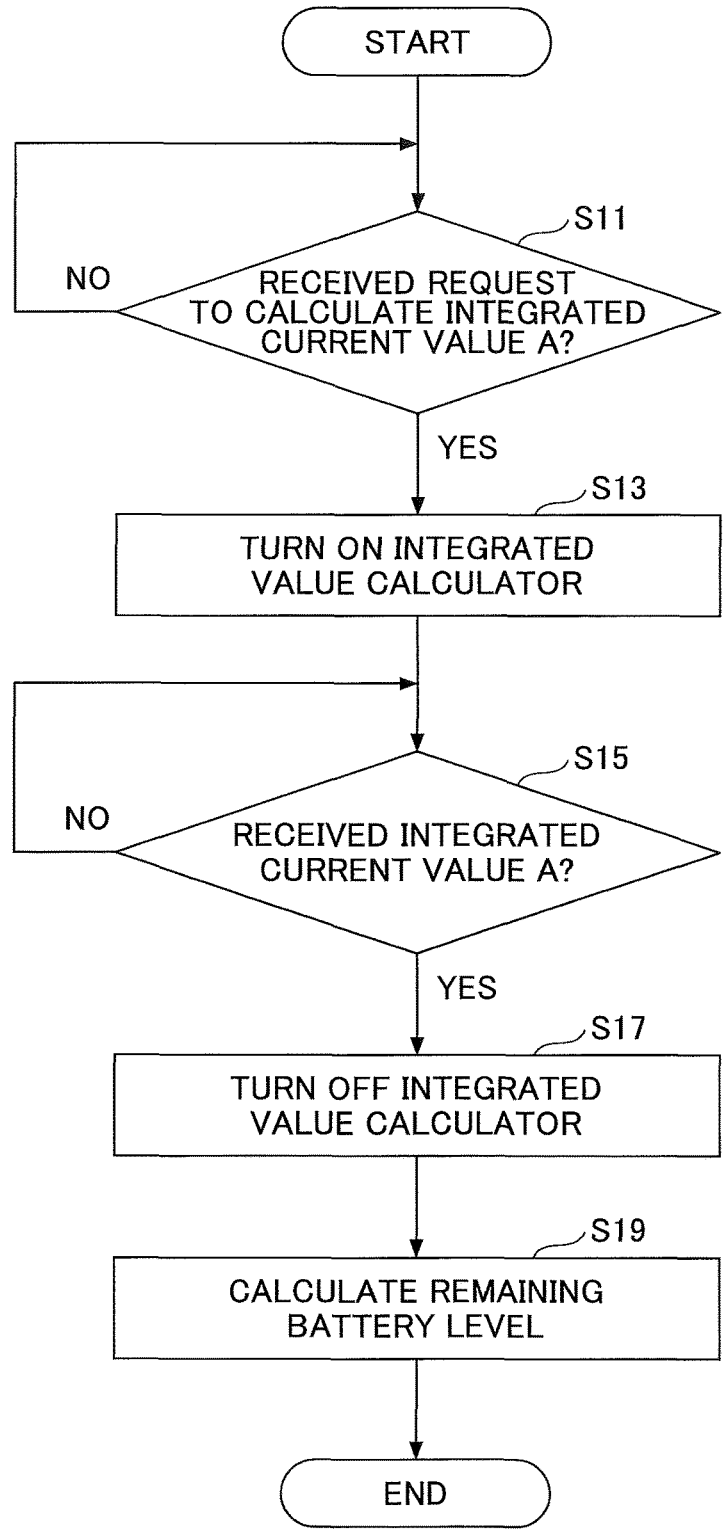
FIG. 4 is a flowchart illustrating an example of an operation of an MCU of a signal processor according to the first embodiment.

FIG. 4 is a flowchart illustrating an example of an operation of an MCU of a signal processing unit according to the first embodiment.

In step S11, the MCU 17 determines whether the MCU 17 has received a request to calculate the integrated current value A. For example, when the remaining battery level data transmission request signal is input, it is necessary to calculate the integrated current value A; the MCU 17 thus determines that the MCU 17 has received the request to calculate the integrated current value A. When the MCU 17 determines that the MCU 17 has received the request to calculate the integrated current value A, the MCU 17 executes the process of step S13.

In step S13, the MCU 17 operates the cutoff switch 20 to turn on the power supply to the integrated value calculator 13 from off. As a result, power is supplied to the integrated value calculator 13, enabling the integrated value calculator 13 to calculate the integrated current value A.

In step S15, the MCU 17 determines whether the MCU 17 has received the integrated current value A calculated by the integrated value calculator 13.

In step S17, in a case where the MCU 17 determines that the MCU 17 has received the integrated current value A, the MCU 17 operates the cutoff switch 20 to turn off the power supply to the integrated value calculator 13 from on. As a result, the power supplied to the integrated value calculator 13 is cut off. As a result, the power consumed by the operation of the integrated value calculator 13 may be reduced.

In step S19, the MCU 17 calculates the remaining battery level of the secondary battery 12 based on the integrated current value A. The MCU 17 executes a predetermined process using the calculated remaining battery level data of the secondary battery 12. For example, the MCU 17 executes a process of transmitting the remaining battery level data to the outside via the antenna 19, or executes a process of displaying the remaining battery level data on the display.

Figure 5:
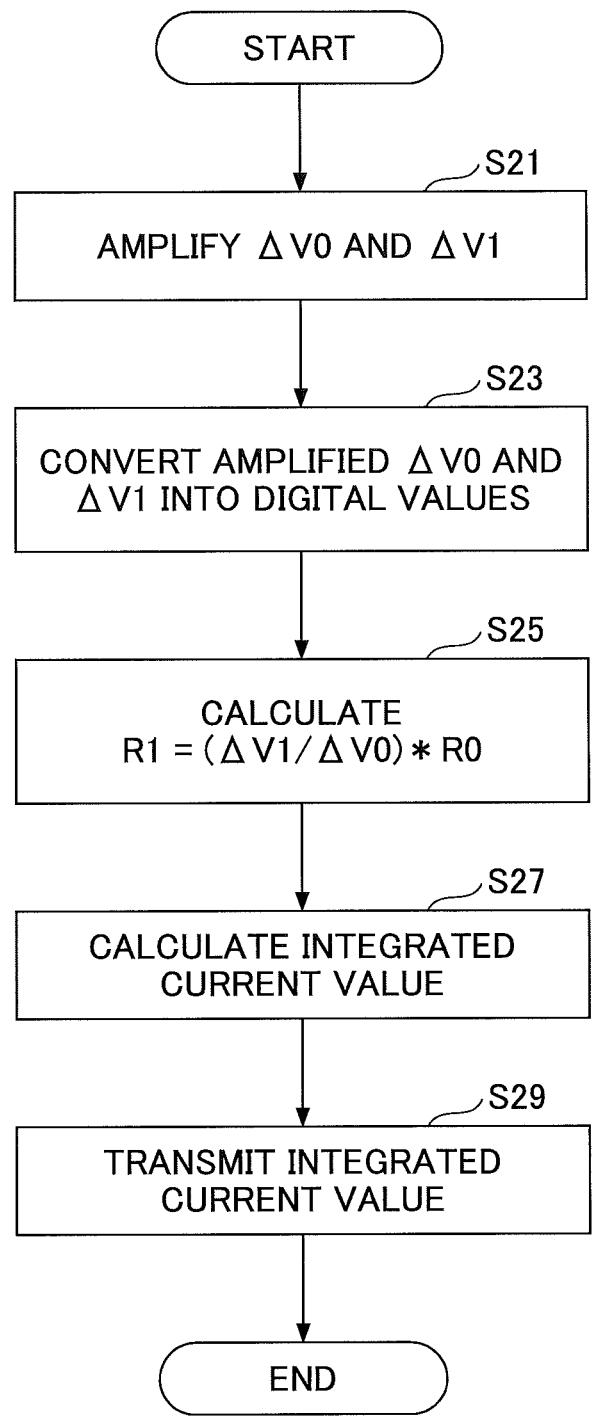
FIG. 5 is a flowchart illustrating an example of the operation of an integrated value calculator according to the first embodiment.

FIG. 5 is a flowchart illustrating an example of the operation of an integrated value calculator according to the first embodiment. The integrated value calculator 13 is activated by being turned on by the MCU 17 in step S13 of FIG. 4, and starts a process of calculating the integrated current value A.

In step S21, the integrated value calculator 13 amplifies $\Delta V1$ by the amplifier 25 and amplifies $\Delta V0$ by the amplifier 24. In step S23, the integrated value calculator 13 converts the amplified $\Delta V0$ and $\Delta V1$ into respective digital values in the ADCs 26 and 27. In step S25, the integrated value calculator 13 calculates the resistance value R1 in the arithmetic-logic unit 28. In step S27, the arithmetic-logic unit 28 of the integrated value calculator 13 refers to the storage unit 29 and calculates the integrated current value A corresponding to the resistance value R1 based on the relationship illustrated in FIG. 2. In step S29, the integrated value calculator 13 transmits the integrated current value A calculated by the arithmetic-logic unit 28 to the MCU 17. When the integrated current value A is transmitted to the MCU 17, the MCU 17 turns off the integrated value calculator 13 in step S17 of FIG. 4, and the integration operation of the current I stops.

Note that FIGS. 1 and 3 illustrate examples in which the MCU 17 and the integrated value calculator 13 are separately provided. However, the MCU 17 may include at least one of the storage unit 29 configured to store correspondence information such as a lookup table, the arithmetic-logic unit 28 having a division circuit, and ADCs 26 and 27.

Specifically, when no request is received from the MCU 17, the integrated value calculator 13 may be turned off when the secondary battery 12 is charged. During the charging period of the secondary battery 12, a current flows in a direction opposite to a direction of current flowing through the element 11 when the battery is consumed, and the resistance value R1 of the element 11 is set in consideration of current to be measured at the time of battery consumption.

Figure 6:
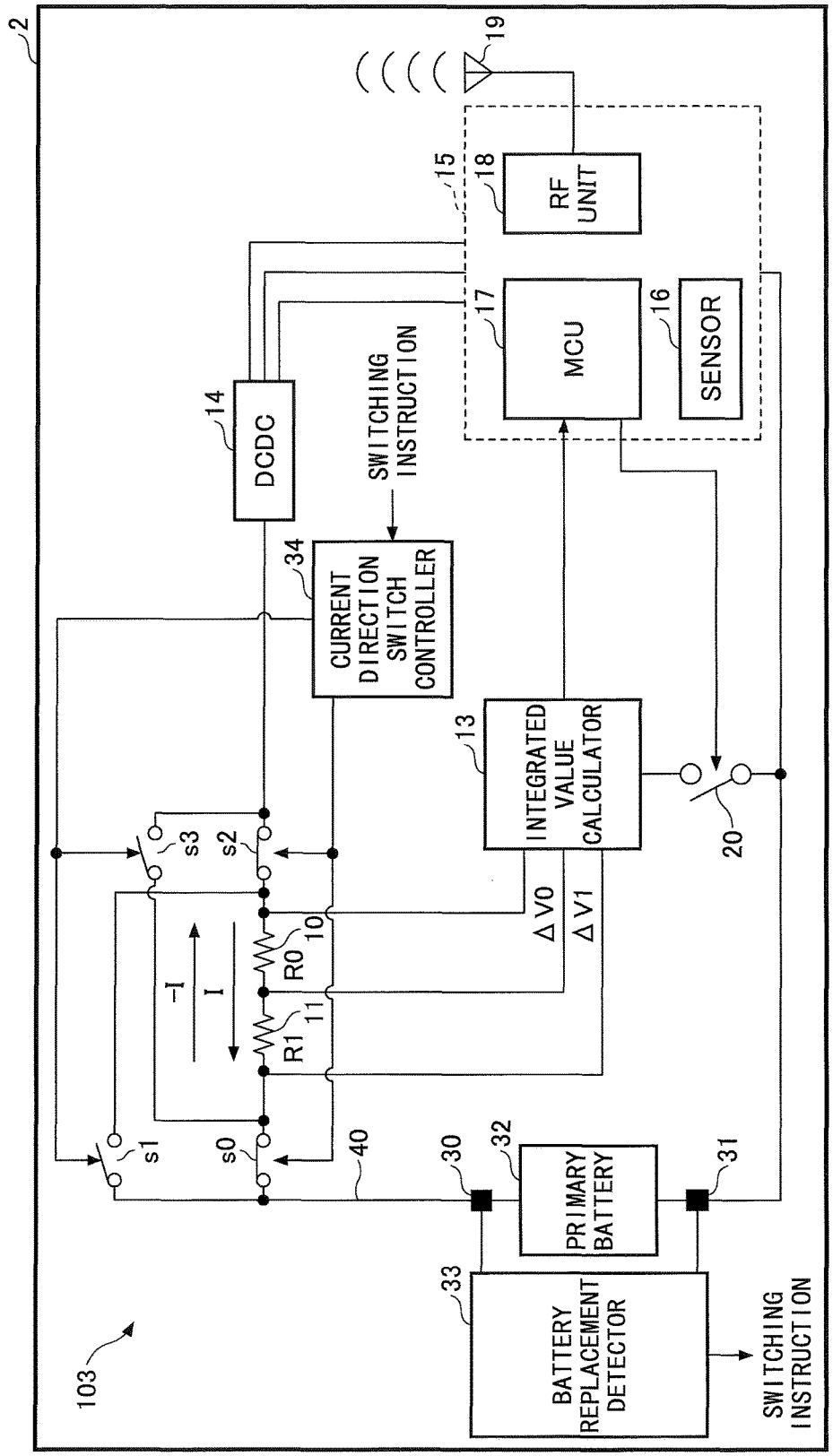
FIG. 6 is a diagram illustrating an example of a configuration of an electronic device according to a second embodiment.

FIG. 6 is a diagram illustrating an example of a configuration of an electronic device according to a second embodiment. Description of the same configuration and functions as those of the electronic device 1 according to the first embodiment will be omitted with reference to the above description. The electronic device 2 illustrated in FIG. 6 is an example of a device powered by a primary battery 32 such as a dry-cell battery. A specific example of the electronic device 2 is the same as that of the electronic device 1. The function of sending a signal to report a replacement timing of the primary battery 32 is also the same as in the case of the electronic device 1. A case of the electronic device 2 being the sensor node 4 may be the same as the case of the electronic device 1 being the sensor node 4.

In the primary battery 32, since there is no charging operation as in the secondary battery 12, it is not possible to switch the current direction by attaching or detaching the charger 22. Hence, as a unit configured to switch the direction of the current I flowing through the elements 10 and 11 every time the primary battery 32 is replaced, an integrated current value measuring device 103 of the electronic device 2 includes a battery replacement detector 33, a current direction switch controller 34, and switches s0 to s3.

The battery replacement detector 33 detects replacement of the primary battery 32 by monitoring battery replacement points 30 and 31. The battery replacement point 30 is located in the current path 40 on the positive electrode side of the primary battery 32 and the battery replacement point 31 is located in the current path 40 on the negative electrode side of the primary battery 32. When detecting replacement of the primary battery 32, the battery replacement detector 33 outputs a switching instruction signal for switching the direction in which the current I flows. The current direction switch controller 34 is an example of a current direction inverter configured to invert the direction of the current I flowing through the elements 10 and 11 according to the switching instruction signal.

The current direction switch controller 34 turns on or off the switches s0 to s3 to invert the direction of the current I. The switch s0 is inserted in series with the current path 40 between the primary battery 32 and the elements 10 and 11, and the switch s2 is inserted in series with the current path 40 at a location opposite to the switch s0 with respect to the elements 10 and 11. The switch s1 is inserted in series with a bypass circuit connecting a segment that is between the positive electrode of the primary battery 32 and the switch s0 with a segment that is between the elements 10 to 11 and the switch s2. The switch s3 is inserted in series in a bypass circuit connecting a segment between the switch s0 and the elements 10 and 11 with a portion opposite to the elements 10 and 11 with respect to the switch s2.

The current direction switch controller 34 turns on the switches s0 and s2 and turns off the switches s1 and s3 at the time of an odd-numbered instance of battery consumption (discharge). As a result, the current I at an odd-numbered instance of battery consumption may flow in the order of the switch s0, the element 11, the element 10, and the switch s2. Conversely, the current direction switch controller 34 turns off the switches s0 and s2 and turns on the switches s1 and s3 at the time of an even-numbered instance of battery consumption (discharge). As a result, the current I at an even-numbered instance of battery consumption may flow in the order of the switch s1, the element 10, the element 11, and the switch s3. That is, the direction of the current I flowing through the elements 10 and 11 may be inversed between the odd-numbered instance of battery consumption and the even-numbered instance of battery consumption.

Figure 7:
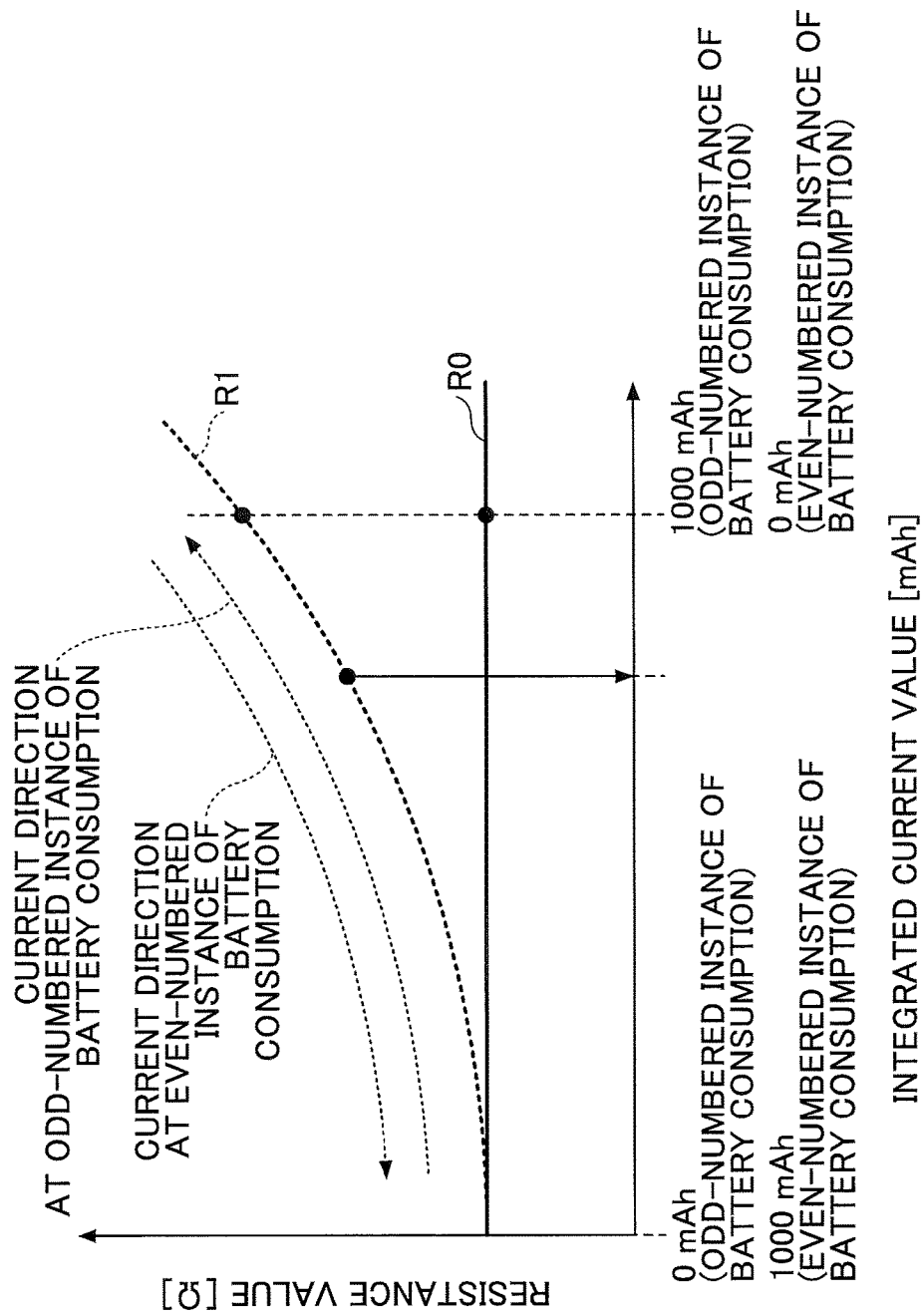
FIG. 7 is a diagram illustrating an example of a relationship between an integrated current value and a resistance value.

FIG. 7 is a diagram illustrating an example of a relationship between an integrated current value and a resistance value. The direction of the current I flowing through the elements 10 and 11 is switched every time the primary battery 32 is replaced. As a result, it is possible to obtain a characteristic whererby the resistance value R1 increased by the integrated value of current at an odd-numbered instance of battery consumption is offset by the integrated value of current at an even-numbered instance of battery consumption, and returns to the original value. Hence, it is possible to calculate the integrated current value any number of times.

Note that the measurement mechanism is basically the same as that in the first embodiment; however, the direction of the current flowing in the element 11 is reversed between an odd-numbered instance of battery consumption and an even-numbered instance of battery consumption, and the characteristic of varying the resistance value R1 of the element 11 is also reversed. Hence, lookup tables to be referenced differ between the odd-numbered instances of battery consumption and the even-numbered instances of battery consumption, and respective lookup tables are saved in the storage unit 29 in advance.

Figure 8:
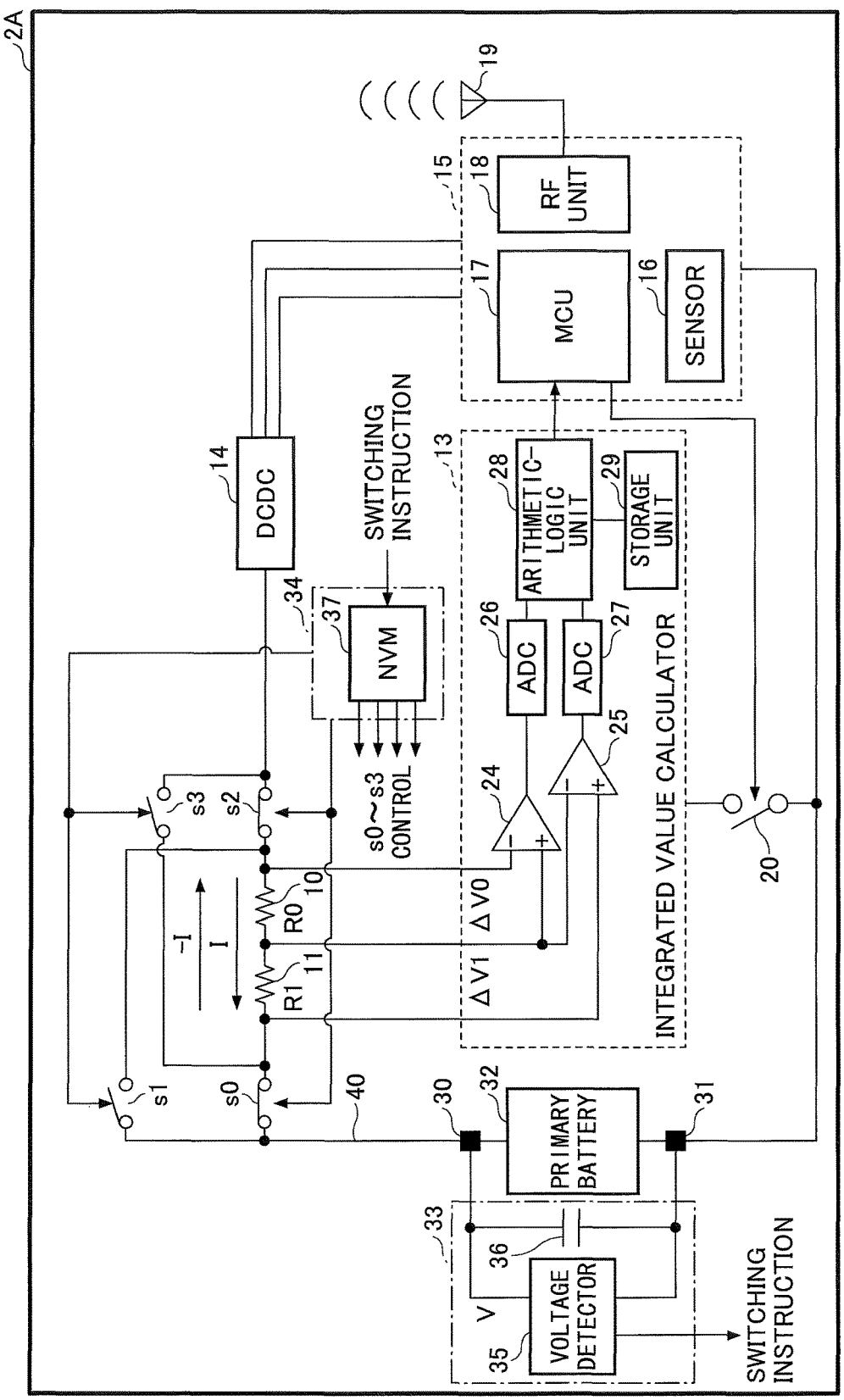
FIG. 8 is a diagram illustrating a first specific example of the configuration of the electronic device according to the second embodiment.

FIG. 8 is a diagram illustrating a first specific example of the configuration of the electronic device according to the second embodiment. An electronic device 1A illustrated in FIG. 8 is an example of the electronic device 2 illustrated in FIG. 6. FIG. 8 illustrates an example in which the direction of the current I is switched when the primary battery 32 is detached.

The battery replacement detector 33 includes a capacitor 36 and a voltage detector 35 in order to detect replacement of the primary battery 32 when the primary battery 32 is detached.

Even when the primary battery 32 is detached, the capacitor 36 temporarily retains the voltage V between the battery replacement points 30 and 31 to moderate a decreasing rate of the voltage V. The capacitor 36 is connected in parallel with the primary battery 32. The voltage detector 35 detects the voltage V (i.e., the voltage V of the capacitor 36) between the battery replacement points 30 and 31.

Further, the current direction switch controller 34 includes a memory configured to save states of the switches s0 to s3 and the lookup table. Since the power supply is cut off at the time of battery replacement, the current direction switch controller 34 includes a non-volatile memory (NVM) 37 in order to retain the states of the switches s0 to s3 and the lookup table.

Figure 9:
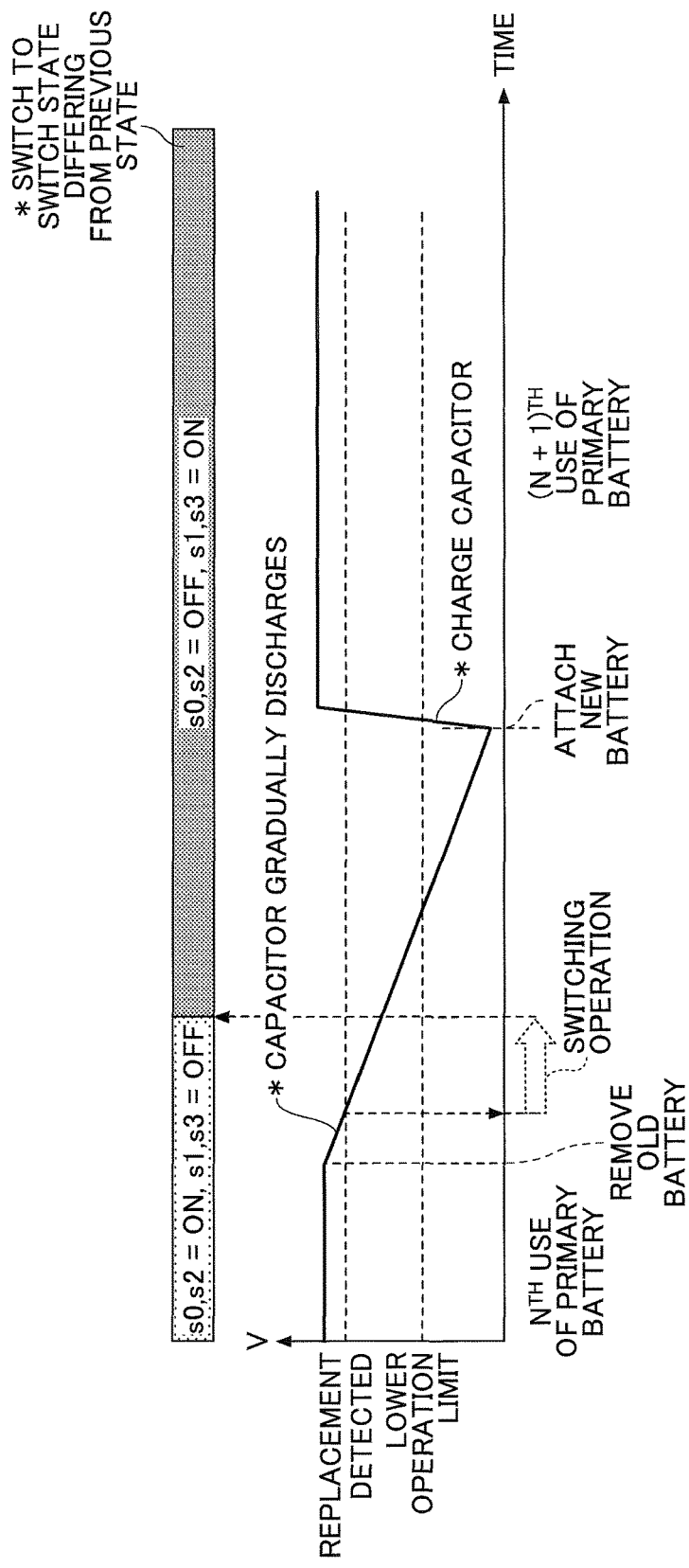
FIG. 9 is a timing chart illustrating an example of a voltage change at the time of detaching a battery.

FIG. 9 is a timing chart illustrating an example of a voltage change at the time of detaching a battery. When the primary battery 32 is removed, the capacitor 36 is discharged and the voltage V of the capacitor 36 gradually drops. When the voltage V of the capacitor 36 drops below a predetermined replacement detection level, the voltage detector 35 outputs a switching instruction signal. The current direction switch controller 34 switches the direction of the current I according to the switching instruction signal. The current direction switch controller 34 completes the direction switching of the current I before the voltage V of the capacitor 36 drops to the lower operation limit level or lower of the current direction switch controller 34.

Figure 10:
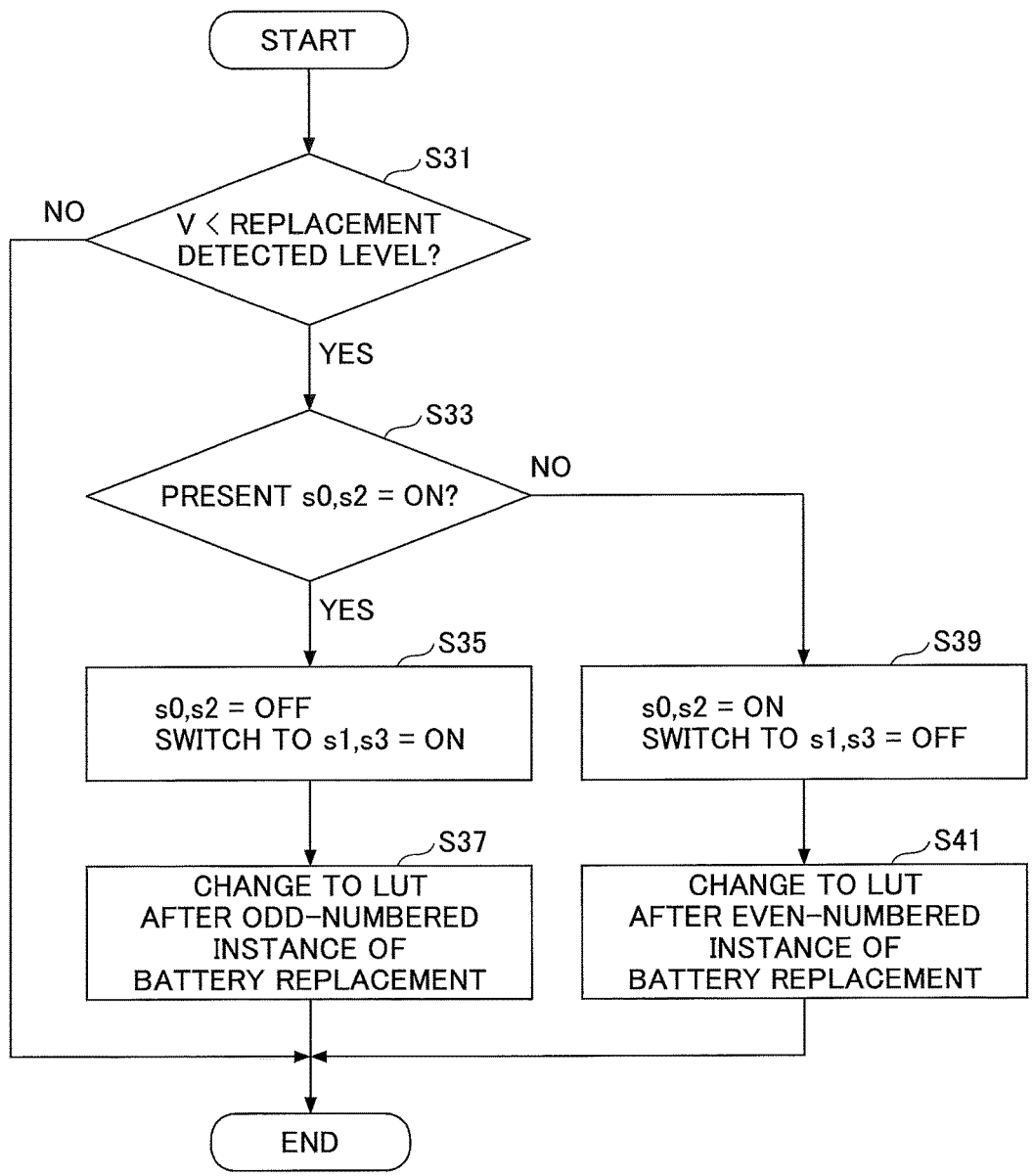
FIG. 10 is a flowchart illustrating an example of an operation of a current direction switch controller at the time of detaching a battery.

FIG. 10 is a flowchart illustrating an example of an operation of a current direction switch controller at the time of detaching a battery.

In step S31, the current direction switch controller 34 determines whether the voltage detector 35 detects that the voltage V has dropped to the replacement detection level or lower (i.e., whether a switching instruction signal has been received). When the voltage detector 35 detects that the voltage V has dropped to the replacement detection level or lower (i.e., when reception of the switching instruction signal is detected), the current direction switch controller 34 executes step S33 in order to start the operation of switching the direction of the current I.

In step S33, the current direction switch controller 34 determines whether the current switches s0 and s2 are ON. When the current switches s0 and s2 are in an ON state, the current direction switch controller 34 turns off the switches s0 and s2, and turns on the switches s1 and s3 (step S35). When the current switches s0 and s2 are in an OFF state, the current direction switch controller 34 turns on the switches s0 and s2, and turns OFF the switches s1 and s3 (step S39).

After the process of step S35, in step S37, the current direction switch controller 34 changes the currently used lookup table to a lookup table to be used after odd-numbered instances of battery replacements. After the process of step S39, in step S41, the current direction switch controller 34 changes the currently used lookup table to a lookup table to be used after even-numbered instances of battery replacements.

Even when the voltage V drops to the lower operation limit level or lower of the current direction switch controller 34, the states of the switches and the lookup table before the voltage V drops to the lower operation limit level of the current direction switch controller 34 are retained in the NVM 37.

Figure 11:
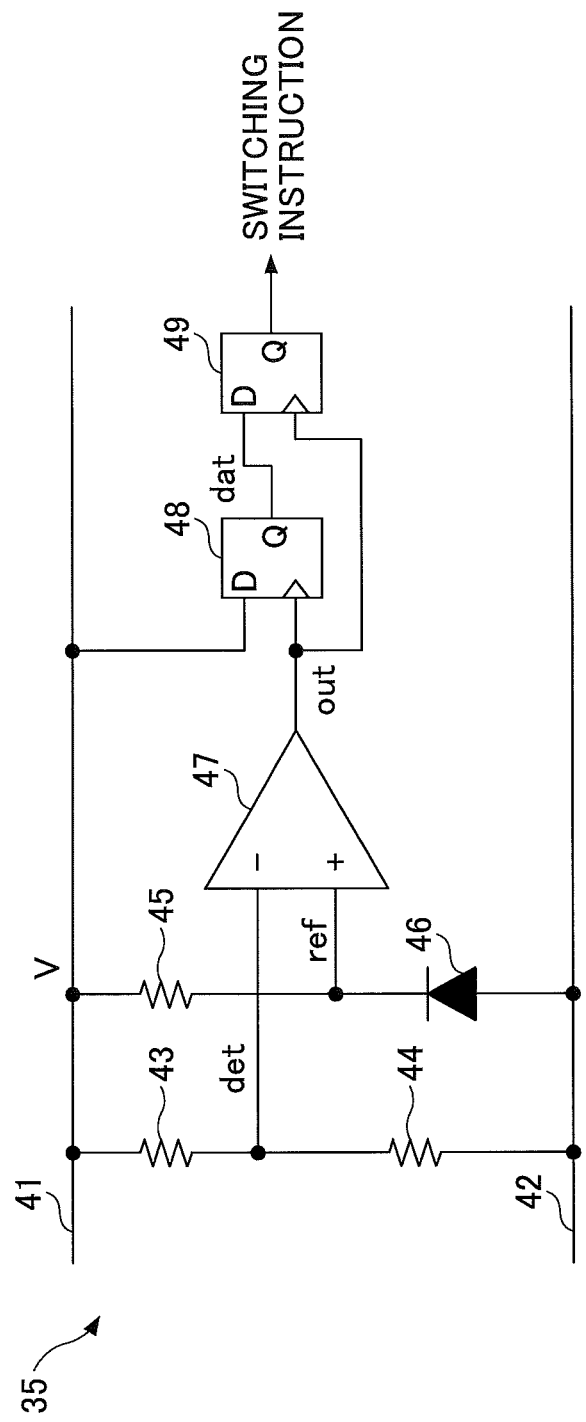
FIG. 11 is a diagram illustrating an example of a configuration of a voltage detector.
Figure 12:
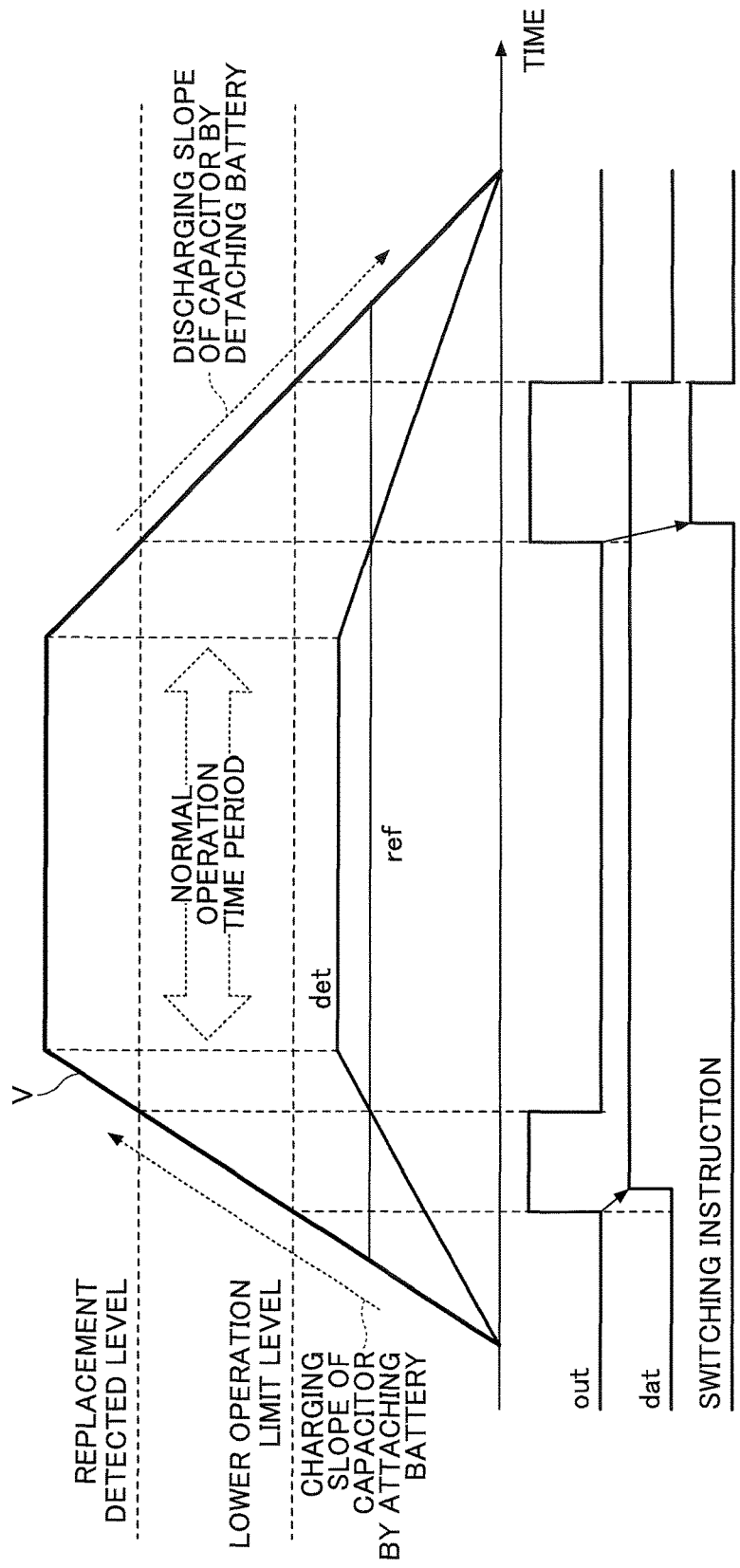
FIG. 12 is a timing chart illustrating an example of an operation of the voltage detector.

FIG. 11 is a diagram illustrating an example of a configuration of a voltage detector. FIG. 12 is a timing chart illustrating an example of an operation of the voltage detector. The voltage detector 35 illustrated in FIG. 11 includes resistors 43, 44, and 45, a diode 46, a comparator 47, and flip-flops 48 and 49. The potential difference between the voltage monitor line 41 and the voltage monitor line 42 corresponds to the voltage V of the capacitor 36.

Voltage V is divided by resistors 43 and 44, and a detection voltage det is generated. The diode 46 is reverse biased by the resistor 45. The reference voltage ref is a constant voltage determined by the reverse bias voltage of the diode 46.

The comparator 47 outputs a low level when the detection voltage det is lower than the reference voltage ref and outputs a high level when the detection voltage det is higher than the reference voltage ref. Note that when the voltage applied to the comparator 47 falls below the lower limit operation level of the comparator 47, the output level of the comparator 47 becomes a low level.

When the level of the output signal out of the comparator 47 transitions from 0 to 1, the flip-flops 48 and 49 determine that Q output is 0 when the D input is 0, and that the Q output is 1 when the D input is 1. When the level of the output signal out is in a state other than in a state where the level changes from 0 to 1, the Q output is retained. When the voltage applied to the flip-flops 48 and 49 falls below the lower operation limit level of the flip-flops 48 and 49, the Q output becomes a low level.

Hence, according to the voltage detector 35 illustrated in FIG. 11, the switching instruction signal illustrated in FIG. 12 may be generated.

Figure 13:
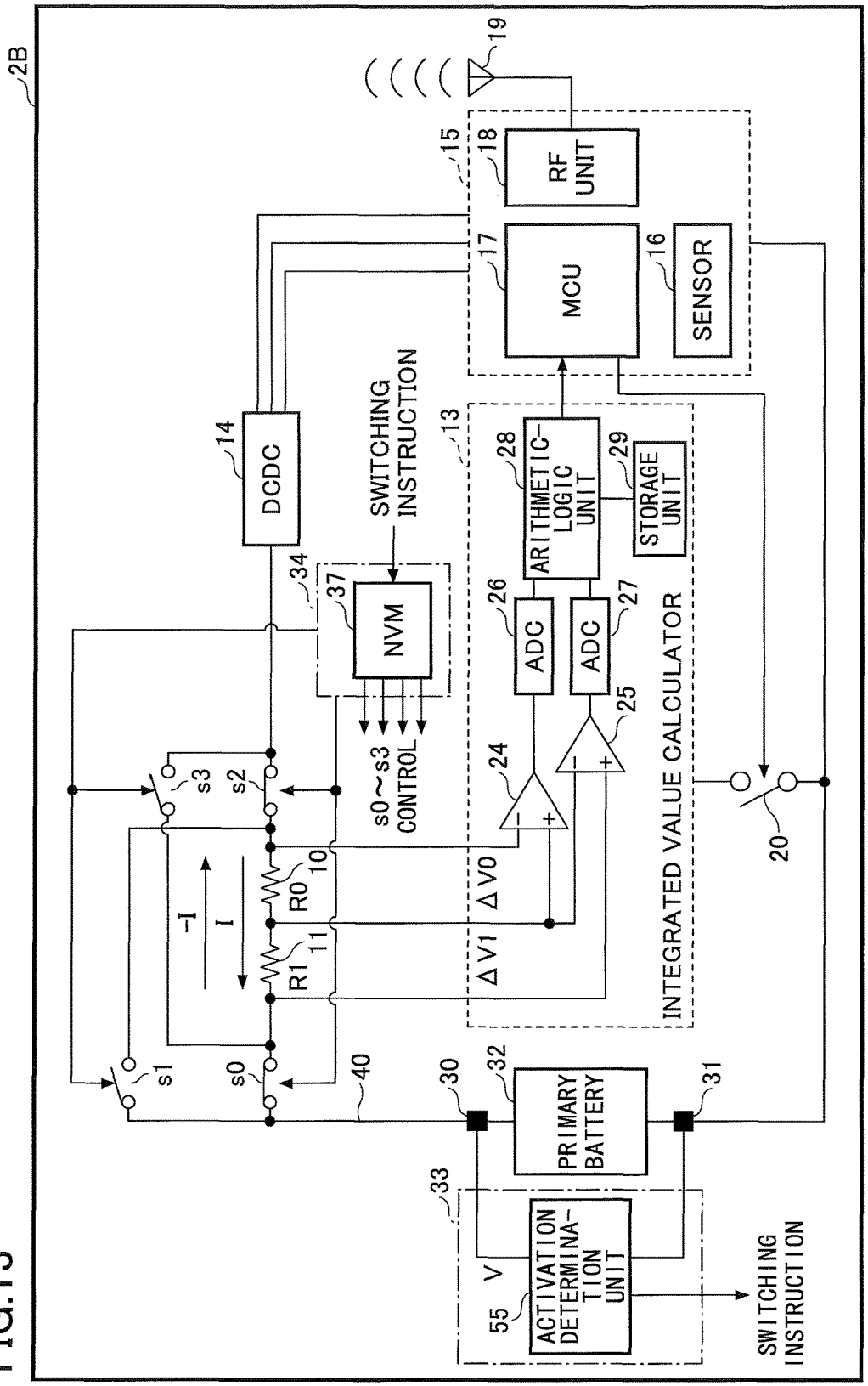
FIG. 13 is a diagram illustrating a second specific example of the configuration of the electronic device according to the second embodiment.

FIG. 13 is a diagram illustrating a second specific example of the configuration of the electronic device according to the second embodiment. An electronic device 2B illustrated in FIG. 13 is an example of the electronic device 2 illustrated in FIG. 6. FIG. 13 illustrates an example in which the direction of the current I is switched when the primary battery 32 is attached.

The battery replacement detector 33 includes an activation determination unit 55 in order to detect replacement of the primary battery 32 when the primary battery 32 is attached. The activation determination unit 55 detects the attachment of the primary battery 32 by detecting the voltage V between the battery replacement points 30 and 31 to which the primary battery 32 is attached.

Figure 14:
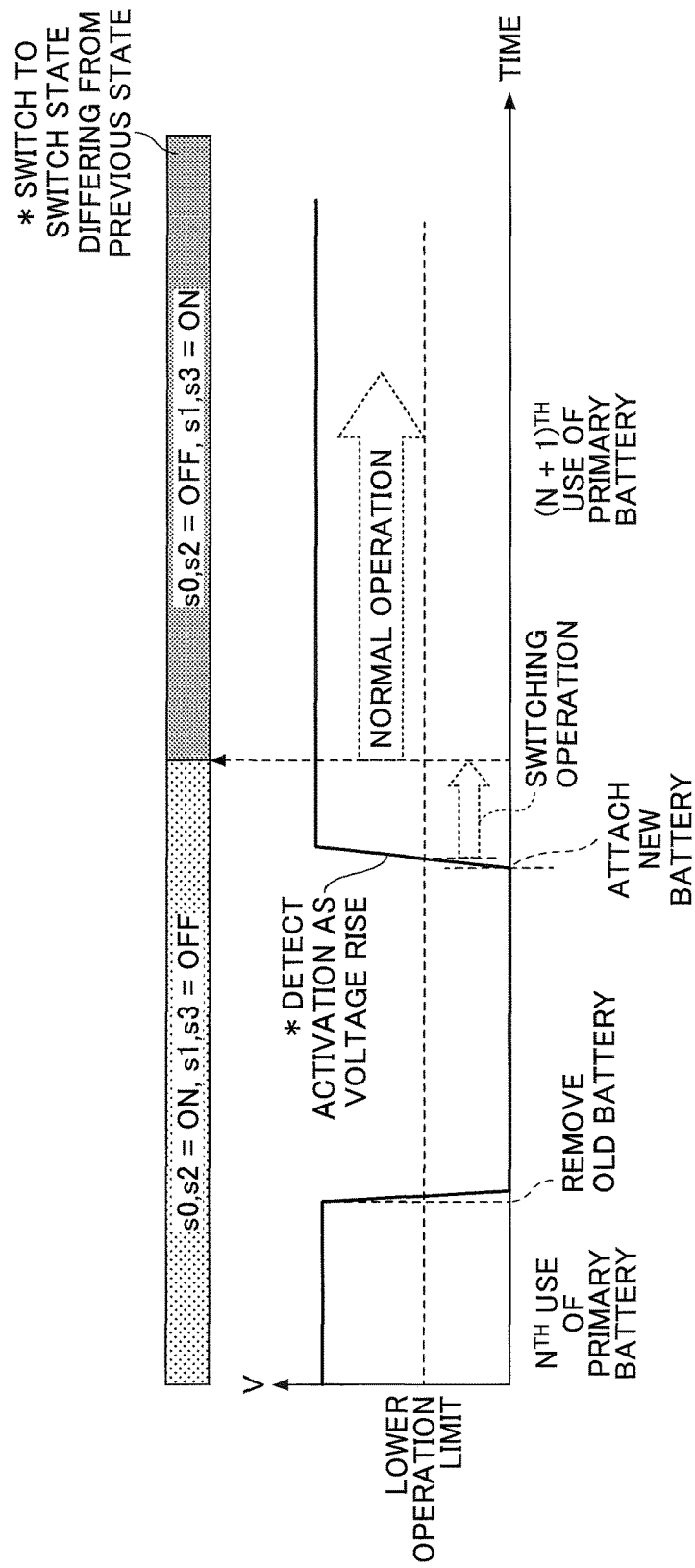
FIG. 14 is a timing chart illustrating an example of a voltage change at the time of attaching a battery.

FIG. 14 is a timing chart illustrating an example of a voltage change at the time of attaching a battery. When the primary battery 32 is attached, the voltage V rapidly rises. Upon detecting a rapid voltage rise of the voltage V, the activation determination unit 55 outputs a switching instruction signal. The current direction switch controller 34 switches the direction of the current I according to the switching instruction signal.

Figure 15:
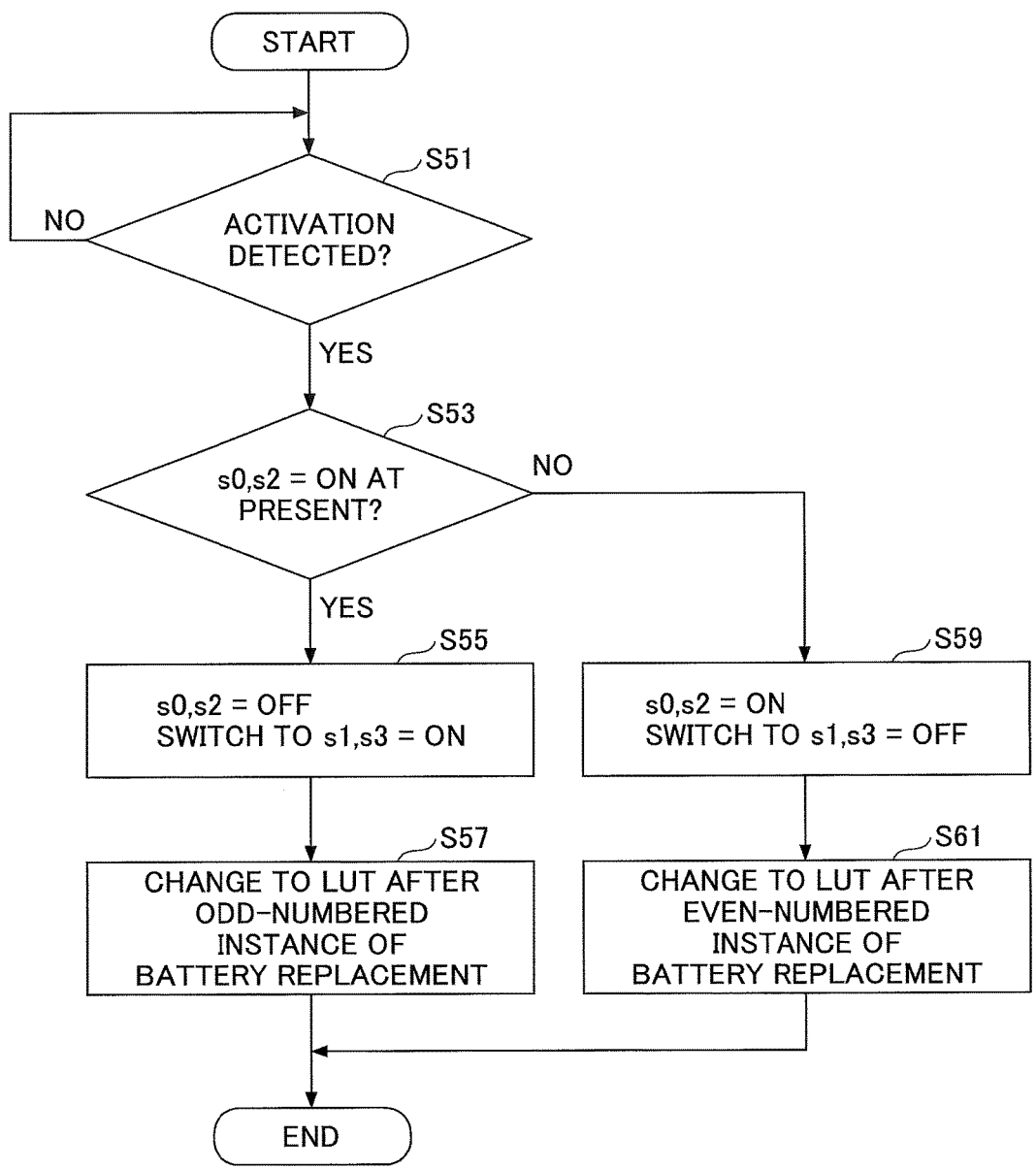
FIG. 15 is a flowchart illustrating an example of an operation of a current direction switch controller at the time of attaching a battery.

FIG. 15 is a flowchart illustrating an example of an operation of a current direction switch controller at the time of attaching a battery.

In step S51, the current direction switch controller 34 determines whether the activation determination unit 55 detects that the voltage V has risen higher than the lower operation limit level (i.e., whether a switching instruction signal is received). When the activation determination unit 55 detects that the voltage V has risen higher than the lower operation limit level (i.e., when reception of the switching instruction signal is detected), the current direction switch controller 34 executes step S53 in order to start the operation of switching the direction of the current I.

In step S53, the current direction switch controller 34 determines whether the current switches s0 and s2 are on by referring to the information stored in the NVM 37. When the current switches s0 and s2 are in an ON state, the current direction switch controller 34 turns off the switches s0 and s2, and turns on the switches s1 and s3 (step S55). When the current switches s0 and s2 are in an OFF state, the current direction switch controller 34 turns on the switches s0 and s2, and turns OFF the switches s1 and s3 (step S59).

After the process of step S55, in step S57, the current direction switch controller 34 changes the currently used lookup table to a lookup table to be used after odd-numbered instances of battery replacements. After the process of step S59, in step S61, the current direction switch controller 34 changes the currently used lookup table to a lookup table to be used after even-numbered instances of battery replacements.

Figure 16:
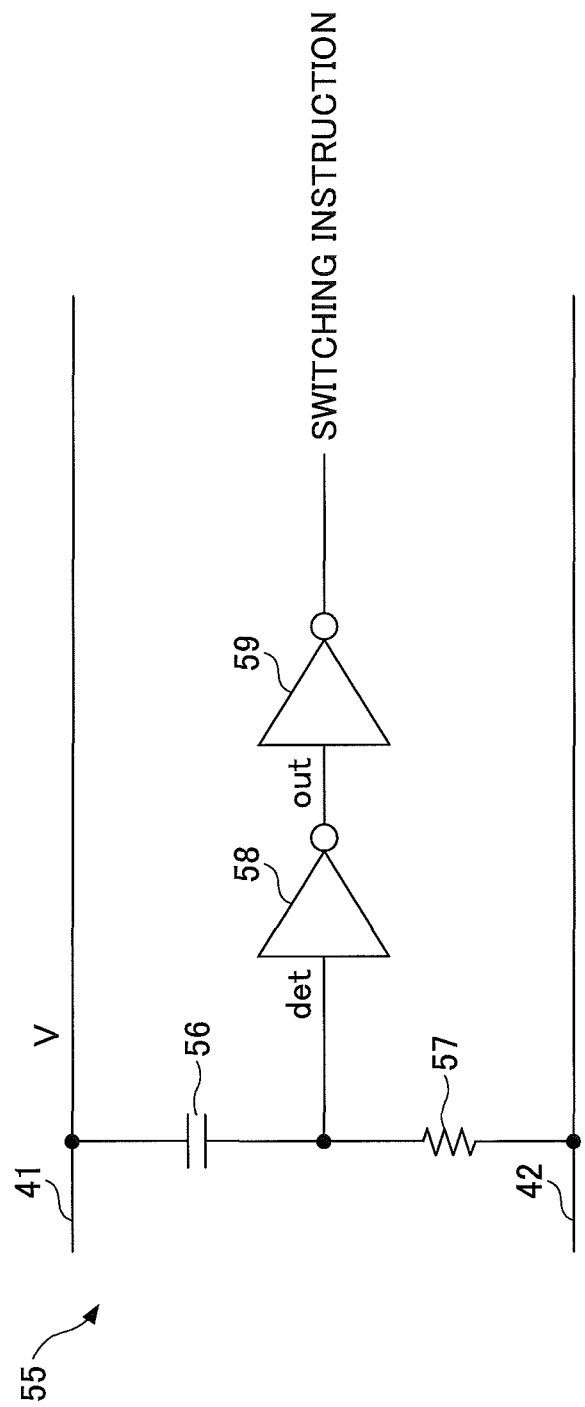
FIG. 16 is a diagram illustrating an example of a configuration of a start determination unit.
Figure 17:
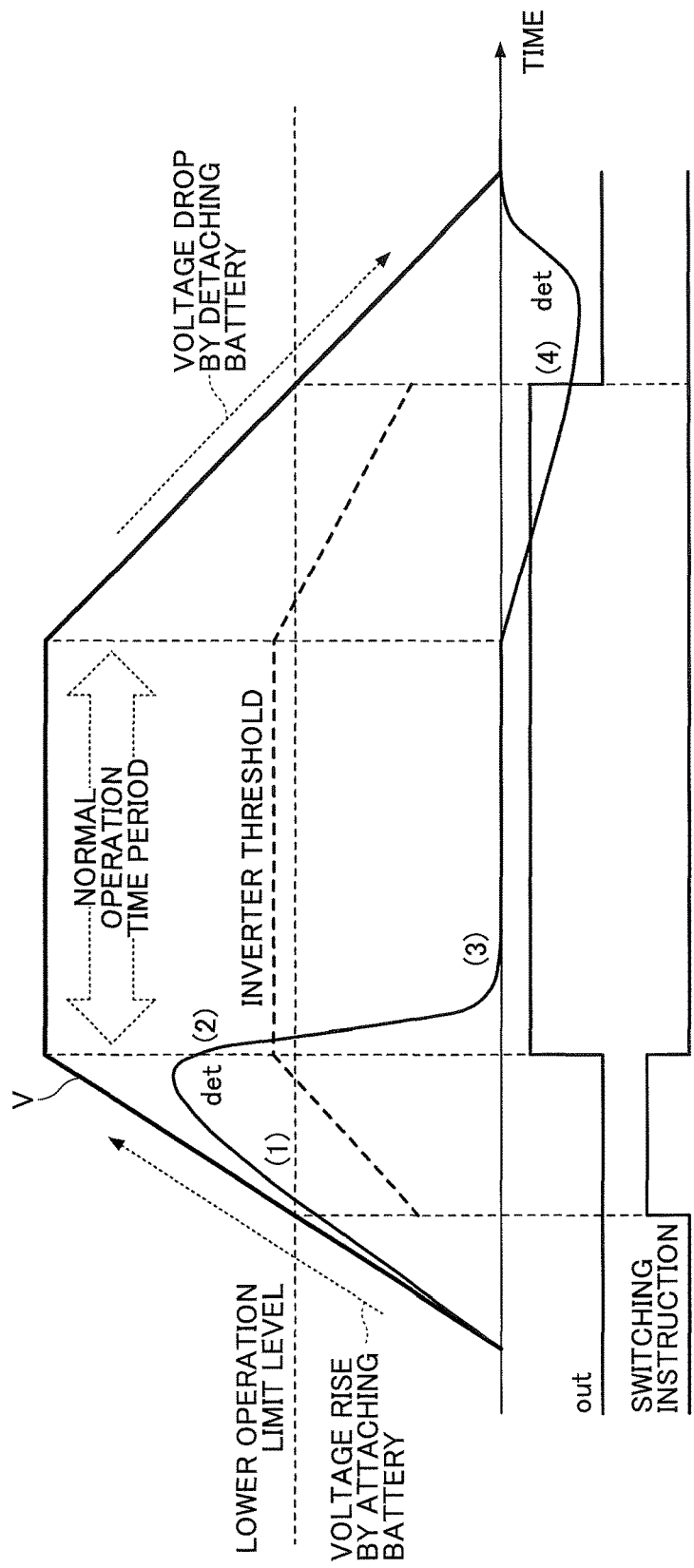
FIG. 17 is a timing chart illustrating an example of an operation of the start determination unit.

FIG. 16 is a diagram illustrating an example of a configuration of an activation determination unit. FIG. 17 is a timing chart illustrating an example of an operation of the activation determination unit. The activation determination unit 55 illustrated in FIG. 16 includes a capacitor 56, a resistor 57, and inverters 58 and 59. The potential difference between the voltage monitor line 41 and the voltage monitor line 42 corresponds to the voltage V of the capacitor 56.

When the inverters 58 and 59 receive a voltage V having a level higher than the inversion threshold value, the inverters 58 and 59 output a low level signal, and when the inverters 58 and 59 receive the voltage V having a level lower than an inversion threshold level, the inverters 58 and 59 output a high level signal. When the inverters 58 and 59 receive the voltage V lower than the lower operation limit level, the inverters 58 and 59 output a low level signal irrespective of the input level of the voltage V of the capacitor 56.

In FIG. 17, (1) indicates that the detection voltage det rises due to a coupling effect by the capacitor 56 when the voltage V rises. In FIG. 17, (2) indicates that when the detection voltage det increases, the discharge current by the resistor 57 increases and the detection voltage det drops. In FIG. 17, (3) indicates that when the rise of the voltage V ceases, the coupling effect by the capacitor 56 disappears and the detection voltage det settles to zero volts. In FIG. 17, (4) indicates that when the voltage V decreases, the detection voltage det drops due to the capacitor 56, such that there is no logical change.

Hence, according to the voltage detector 55 illustrated in FIG. 16, the switching instruction signal illustrated in FIG. 17 may be generated.

FIG. 18 is a diagram illustrating an example of an input-output relationship of an amplifier. FIG. 18 exemplifies a case of the amplifiers 24 and 25 configured to amplify small-amplitude voltages $\Delta V1$ and $\Delta V0$. FIG. 18 exemplifies a case of "analog output value [mV]=10×$\Delta V$+500". That is, the amplifiers 24 and 25 have a differential amplifier with a 10-fold amplification factor and a level shifter with +500 mV.

In the first embodiment, a polarity (direction) of the current I is inversed at the time of battery charging and at the time of battery consumption, and in the second embodiment, a polarity (direction) of the current I is inversed at the time of odd-numbered instances of battery consumption and even-numbered instances of battery consumption. Accordingly, the amplifiers 24 and 25 that are able to handle the inversion of the polarity of the input potential are used. In a case where the amplifiers 24 and 25 that are unable to handle the inversion of the polarity of the input potential are used, a switch configured to invert the input potential to the amplifiers 24 and 25 when the polarity of the current I is inversed is provided in order not to inverse the polarity of the input potential.

FIG. 19 is a diagram illustrating an example of an input-output relationship of an ADC. FIG. 19 illustrates a case of the ADCs 26 and 27 described above. FIG. 19 exemplifies a case of "digital output value=input voltage [mV]=500". That is, the ADCs 26 and 27 have a 10-bit ADC and a subtractor configured to subtract 500.

The ADCs 26 and 27 receive the output voltages from the amplifiers 24 and 25 as input voltages and convert the received input voltages into digital output values. In this case, in order to simplify the division process of "$\Delta V1/\Delta V0$" in the arithmetic-logic unit 28 in a subsequent stage, the subtraction correction is applied such that the digital output value becomes zero when $\Delta V1$ and $\Delta V0$ are 0 volts.

Figure 20:
FIG. 20 is a diagram illustrating an example of a lookup table at the time of battery charging in the first specific example of the first embodiment.
Figure 21:
FIG. 21 is a diagram illustrating an example of a lookup table at the time of battery discharging in the first specific example of the first embodiment.

FIG. 20 is a diagram illustrating an example of a lookup table at the time of battery charging in the first specific example of the first embodiment. FIG. 21 is a diagram illustrating an example of a lookup table at the time of battery discharging in the first specific example of the first embodiment.

FIGS. 20 and 21 illustrate cases where the resistance value R1 on the vertical axis in FIG. 2 is replaced with the resistance ratio (R1/R0). The lookup tables of FIGS. 20 and 21 are generated by acquiring in advance and mapping experimental data on how the resistance ratio (R1/R0) changes together with the voltage ratio ($\Delta V1/\Delta V0$) with respect to the integrated current value A.

At the time of battery charging in FIG. 20, the integrated current value A directly represents the remaining battery level; hence, in the lookup table, the same values in the columns of the integrated current value A are stored in the columns of the remaining battery level. Since the relationship of "(remaining battery level)=(battery capacity)−(consumed integrated current value)" is established at the time of battery consumption (discharging) in FIG. 21, the value obtained according to this relationship is stored in the lookup table.

Figure 22:
FIG. 22 is a diagram illustrating an example of a lookup table after an even-numbered instance of battery replacement in the first specific example of the second embodiment.
Figure 23:
FIG. 23 is a diagram illustrating an example of a lookup table after an odd-numbered instance of battery replacement in the first specific example of the second embodiment.

FIG. 22 is a diagram illustrating an example of a lookup table after an even-numbered instance of battery replacement in the first specific example of the second embodiment. FIG. 23 is a diagram illustrating an example of a lookup table after an odd-numbered instance of battery replacement in the first specific example of the second embodiment.

Basically, concepts illustrated in FIGS. 20 and 21 are the same. In FIGS. 22 and 23, the direction of current flowing in the element 11 is reversed between the times of odd-numbered instances of battery consumption and even-numbered instances of battery consumption, and the variation characteristic of the resistance value R1 is also reversed, which indicates that the lookup table to be referred to at the time of an odd-numbered instance of battery consumption differs from the lookup table to be referred to at an even-numbered instance of battery consumption.

Note that FIGS. 20 to 23 depict examples of lookup tables. However, when the integrated current value A is represented by a formula as a function of "$\Delta V1/\Delta V0$", such a formula may be stored as a relational rule in the storage unit 29 instead of a lookup table. In this case, the arithmetic-logic unit 28 calculates the integrated current value A according to the above formula with the measured value of "$\Delta V1/\Delta V0$" as an input.

Figure 24:
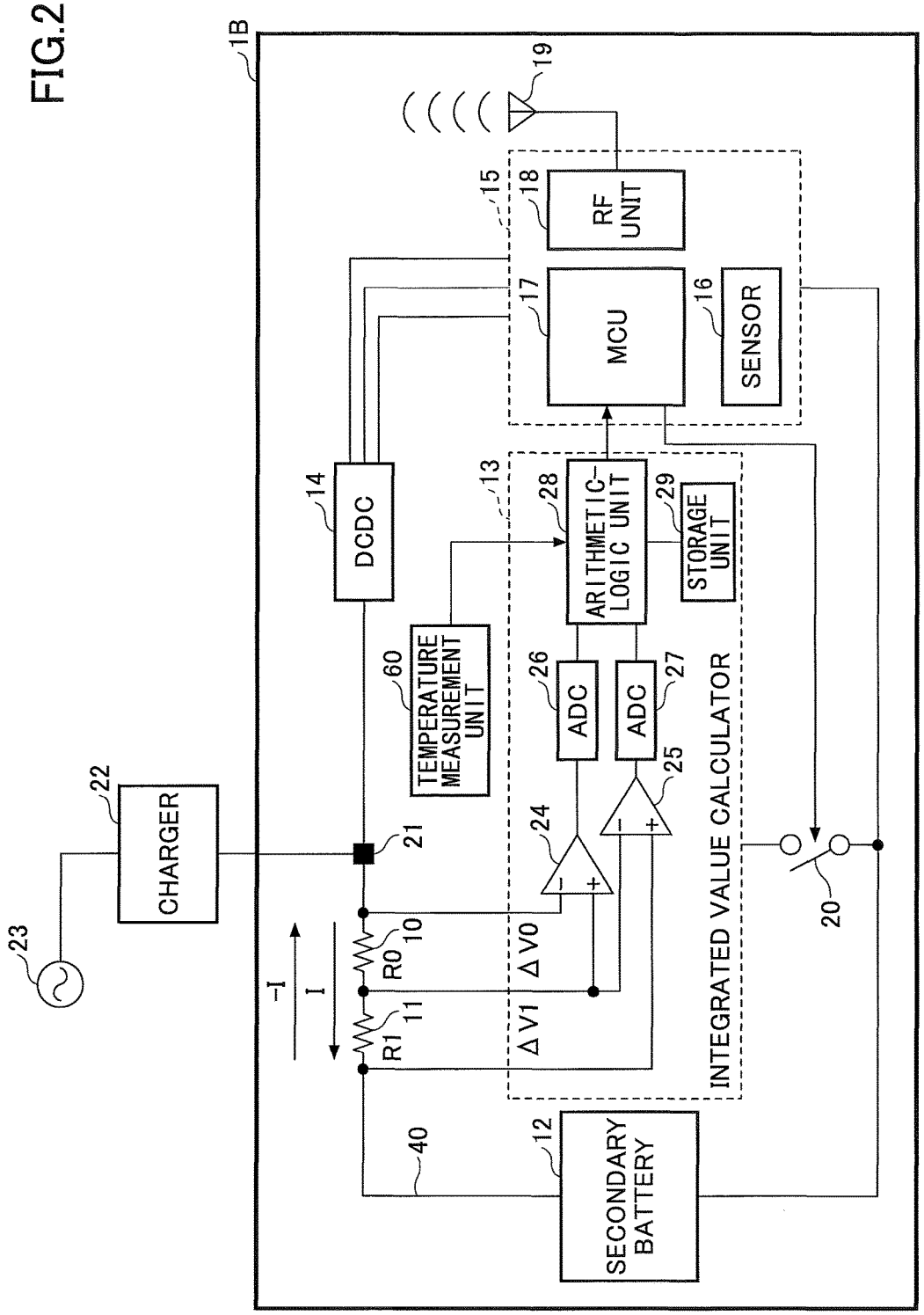
FIG. 24 is a diagram illustrating a second specific example of the configuration of the electronic device according to the first embodiment.

FIG. 24 is a diagram illustrating a second specific example of the configuration of the electronic device according to the first embodiment. An electronic device 1B illustrated in FIG. 24 is an example of the electronic device 1 illustrated in FIG. 1.

Basically, a concept of FIG. 24 is the same as that in the embodiment of FIG. 3 except that additionally, the temperature measurement is performed such that the lookup table to be referred to is selected according to the temperature measurement result. The electronic device 1B includes a temperature measurement unit 60 configured to measure an ambient temperature. The integrated value calculator 13 changes a relation rule for calculating the integrated current value A from the voltages ΔV0 and ΔV1 to a relation rule corresponding to the temperature measurement result obtained by the temperature measurement unit 60.

Figure 25:
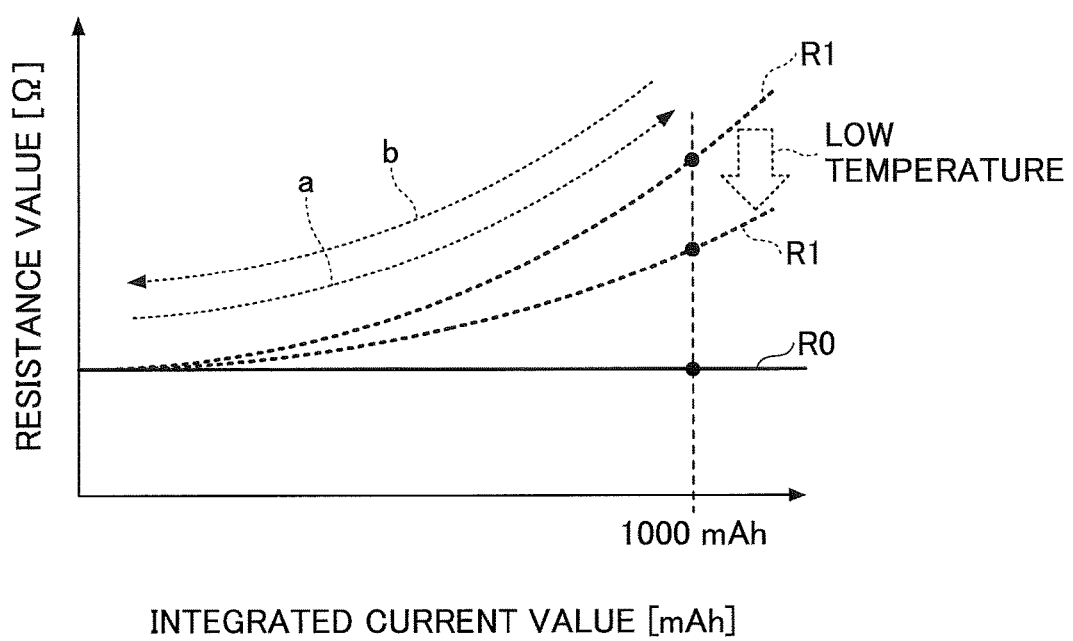
FIG. 25 is a diagram illustrating an example of a relationship between an integrated current value and a resistance value.

FIG. 25 is a diagram illustrating an example of a relationship between an integrated current value and a resistance value. The characteristic of the resistance value R1 with respect to the integrated current value A depends on the temperature. As the temperature decreases, the increase rate of the resistance value R1 with respect to the integrated current value A decreases.

Figure 26:
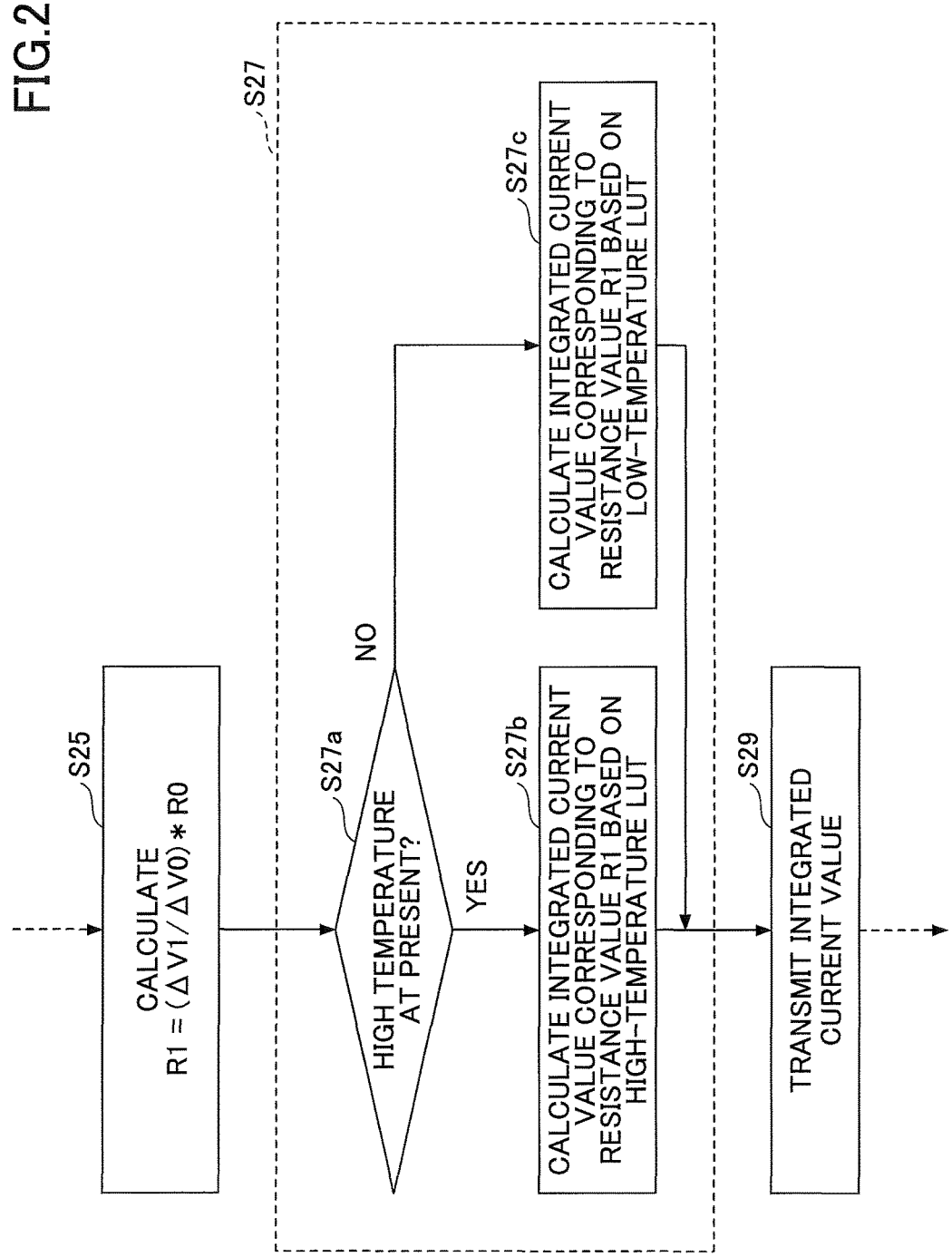
FIG. 26 is a flowchart illustrating an example of the operation of an integrated value calculator according to a second specific example of the first embodiment.

FIG. 26 is a flowchart illustrating an example of the operation of an integrated value calculator according to the first embodiment. Basically, a concept of FIG. 26 is the same as that in the embodiment illustrated in FIG. 5. FIG. 26 differs from FIG. 5 in that whether the current is high temperature or low temperature is determined according to the temperature measurement result, and when the temperature measurement result indicates a high temperature, a high-temperature LUT is referred to, and when the temperature measurement result indicates a low temperature, a low-temperature LUT is referred to.

In step S27a, the integrated value calculator 13 determines whether a current temperature is higher than a predetermined temperature threshold based on the measurement result of the temperature measurement unit 60. When the current temperature is higher than the predetermined temperature threshold, the arithmetic-logic unit 28 of the integrated value calculator 13 refers to the storage unit 29 to calculate the integrated current value A corresponding to the resistance value R1 or the resistance ratio (R1/R0) based on the high-temperature LUT instep S27b (see FIG. 25). When the current temperature is the predetermined temperature threshold or lower, the arithmetic-logic unit 28 of the integrated value calculator 13 refers to the storage unit 29 to calculate the integrated current value A corresponding to the resistance value R1 or the resistance ratio (R1/R0) based on the low-temperature LUT in step S27c (see FIG. 25).

Figure 27:
FIG. 27 is a diagram illustrating an example of a lookup table at the time of battery charging in the second specific example of the first embodiment.
Figure 28:
FIG. 28 is a diagram illustrating an example of a lookup table at the time of battery discharging in the second specific example of the first embodiment.

Examples of the high-temperature LUT and the low-temperature LUT are illustrated in FIGS. 27 and 28. Note that this specific example using the temperature measurement result may be applied to the second embodiment.

Figure 29:
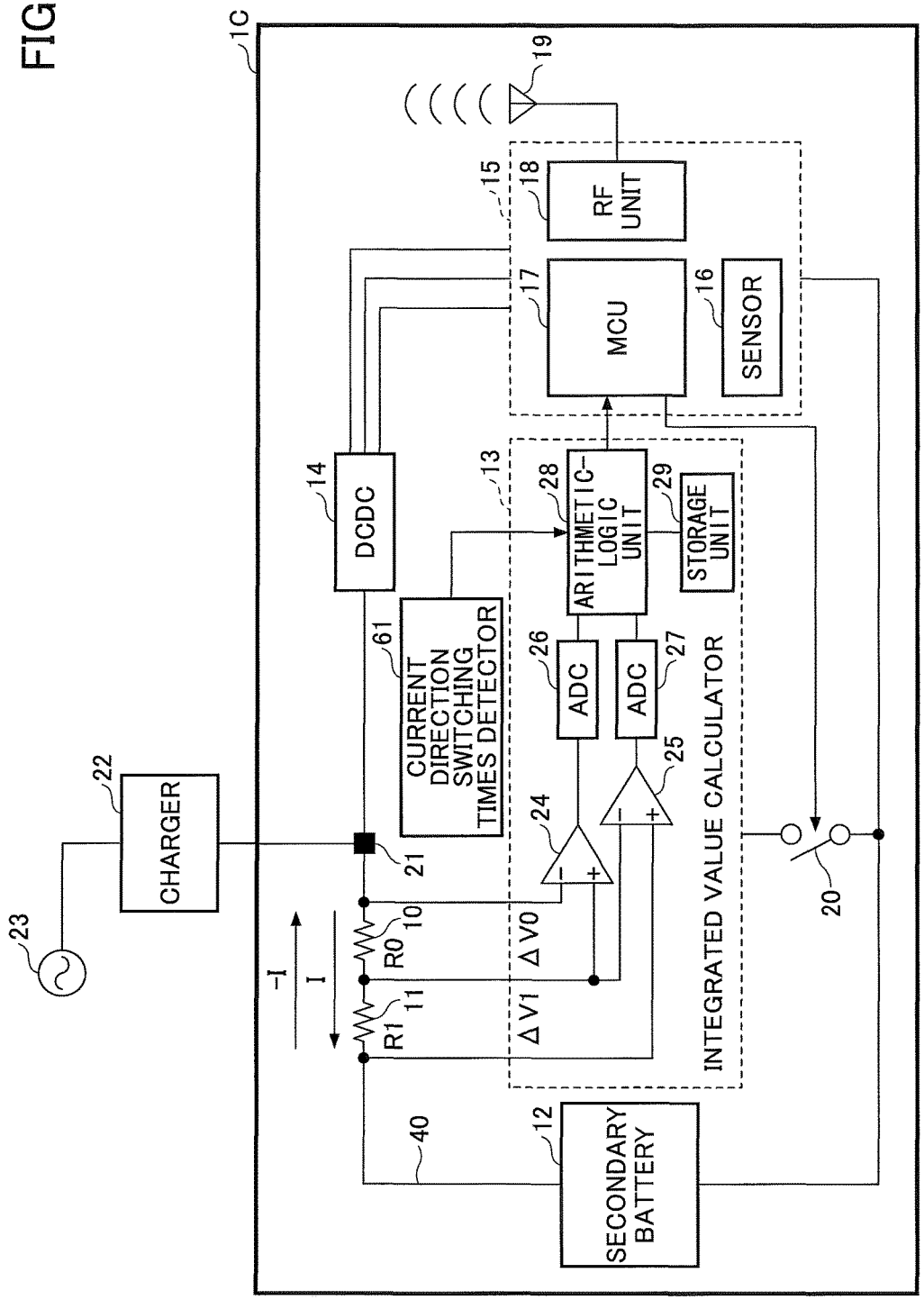
FIG. 29 is a diagram illustrating a third specific example of the configuration of the electronic device according to the first embodiment.

FIG. 29 is a diagram illustrating a third specific example of the configuration of the electronic device according to the first embodiment. An electronic device 1C illustrated in FIG. 29 is an example of the electronic device 1 illustrated in FIG. 1.

Basically, a concept of FIG. 29 is the same as that in the embodiment of FIG. 3 except that the number of times of switching of the current direction of charging and discharging is retained and the lookup table to be referred to is changed depending on whether the number of times of switching of the current direction exceeds a predetermined number of times. The electronic device 1C includes a detector 61 configured to detect a changing number of switching times of the direction of the current I flowing through the elements 10 and 11. The integrated value calculator 13 changes a relation rule for calculating the integrated current value A from the voltages ΔV0 and ΔV1 to a relation rule corresponding to the detected result of the number of times obtained by the detector 61.

Figure 30:
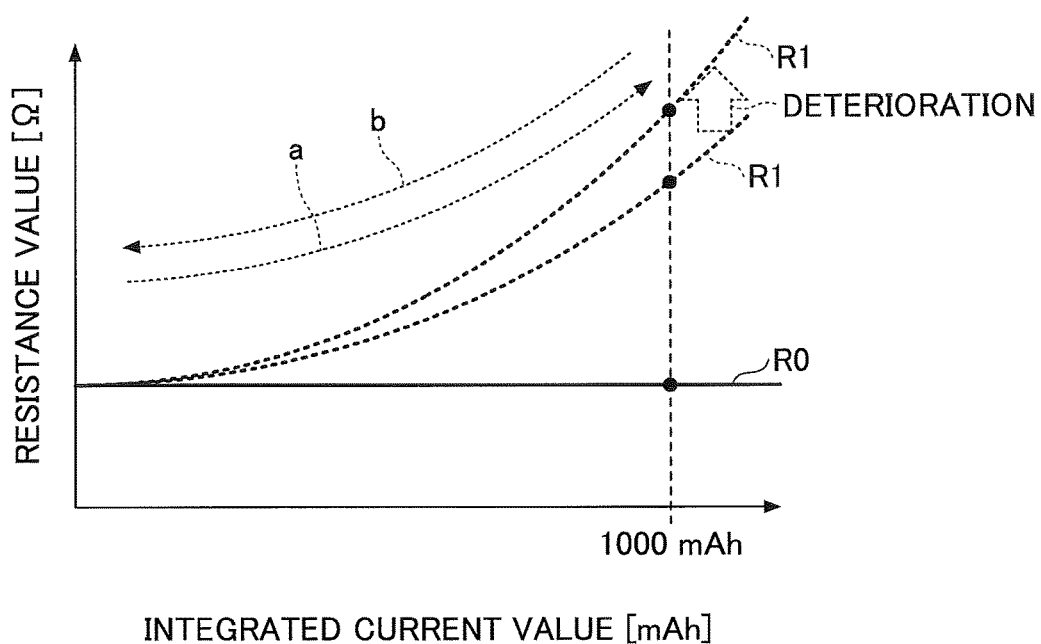
FIG. 30 is a diagram illustrating an example of a relationship between an integrated current value and a resistance value.

FIG. 30 is a diagram illustrating an example of a relationship between an integrated current value and a resistance value. The characteristic of the resistance value R1 with respect to the integrated current value A depends on the switching number of times of current direction. As the switching number of times of the current directions increases, the deterioration of the battery progresses, which raises the increase rate of the resistance value R1 with respect to the integrated current value A.

Figure 31:
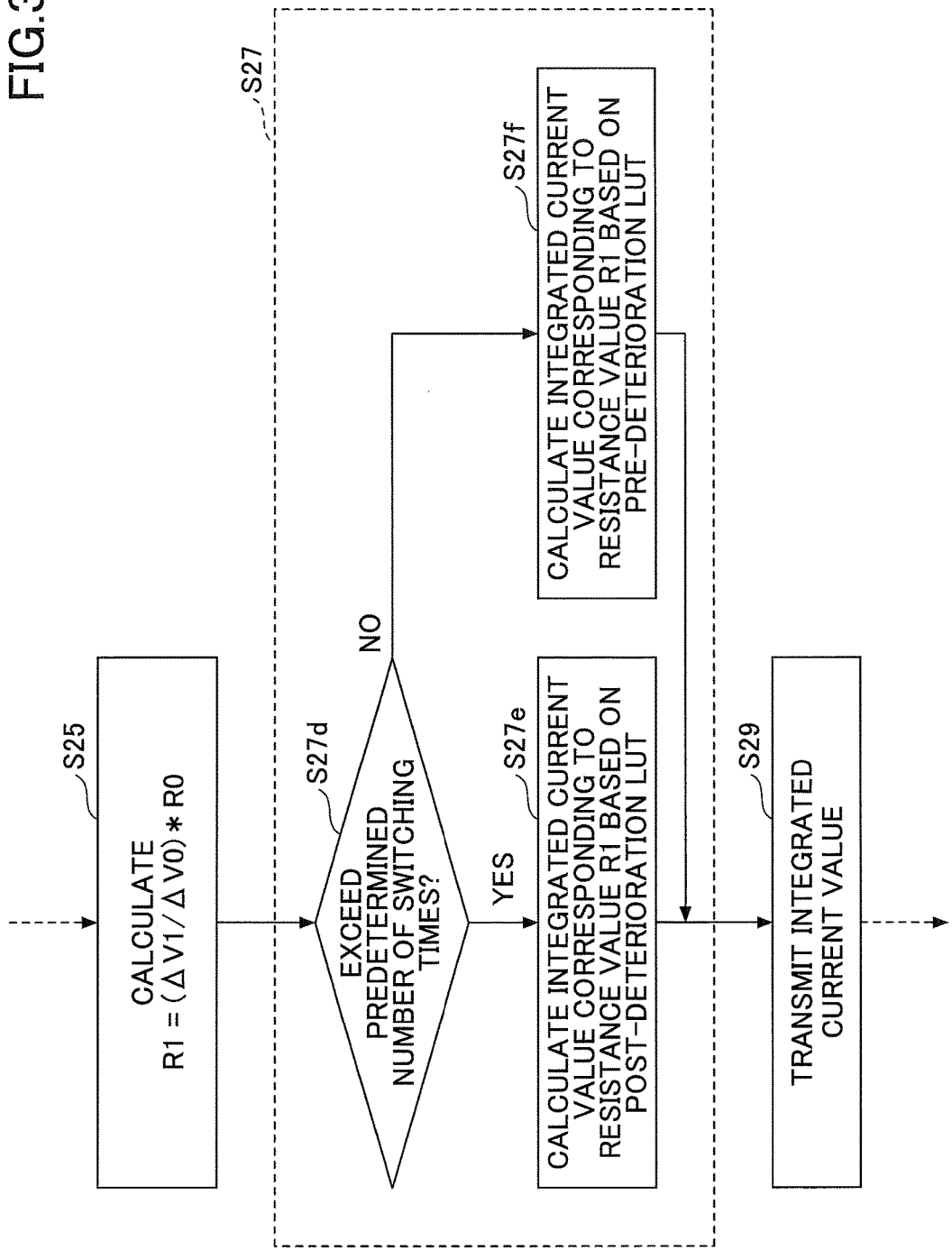
FIG. 31 is a flowchart illustrating an example of the operation of an integrated value calculator according to the third specific example of the first embodiment.

FIG. 31 is a flowchart illustrating an example of the operation of an integrated value calculator according to the first embodiment. Basically, a concept of FIG. 31 is the same as that in the embodiment illustrated in FIG. 5. FIG. 31 differs from FIG. 5 in that whether the switching number of times of charging/discharging exceeds a predetermined number of times; when the switching number of times does not exceed the predetermined number of times, the pre-deterioration LUT is referred to, and when the switching number of times exceeds the predetermined number of times, the post-deterioration LUT is referred to.

In step S27d, the integrated value calculator 13 determines whether the number of switching times of the direction of the current I exceeds the predetermined number of switching times based on the detection result of the detector 61. When the number of switching of the direction of the current I exceeds a predetermined number of switching times, the arithmetic-logic unit 28 of the integrated value calculator 13 refers to the storage unit 29 and calculates the integrated current value A corresponding to the resistance value R1 or the resistance ratio (R1/R0) based on the post-deterioration LUT (see FIG. 30) A in step S27e. When the number of switching of the direction of the current I does not exceed the predetermined number of switching times, the arithmetic-logic unit 28 of the integrated value calculator 13 refers to the storage unit 29 and calculates the integrated current value A corresponding to the resistance value R1 or the resistance ratio (R1/R0) based on the pre-deterioration LUT (see FIG. 30) A in step S27f.

Figure 32:
FIG. 32 is a diagram illustrating an example of a lookup table at the time of battery charging in the third specific example of the first embodiment.
Figure 33:
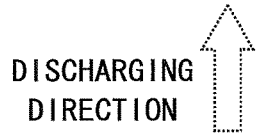
FIG. 33 is a diagram illustrating an example of a lookup table at the time of battery discharging in the third specific example of the first embodiment.

Examples of the pre-deterioration LUT and the post-deterioration LUT are illustrated in FIGS. 32 and 33. Note that this specific example of selecting a relational rule such as a lookup table according to the number of switching times of the current directions may also be applied to the second embodiment.

Figure 34:
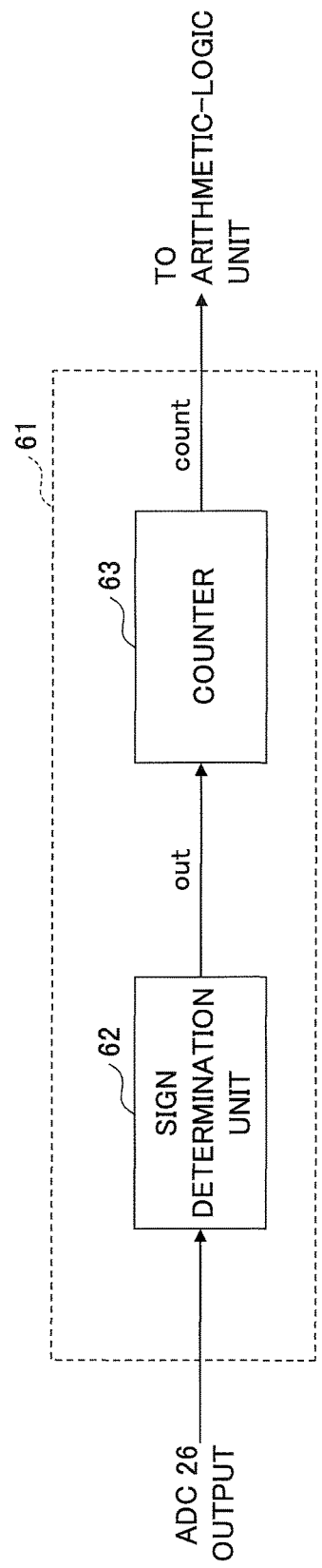
FIG. 34 is a diagram illustrating an example of a configuration of a detector configured to detect the number of switching times of the current directions.
Figure 35:
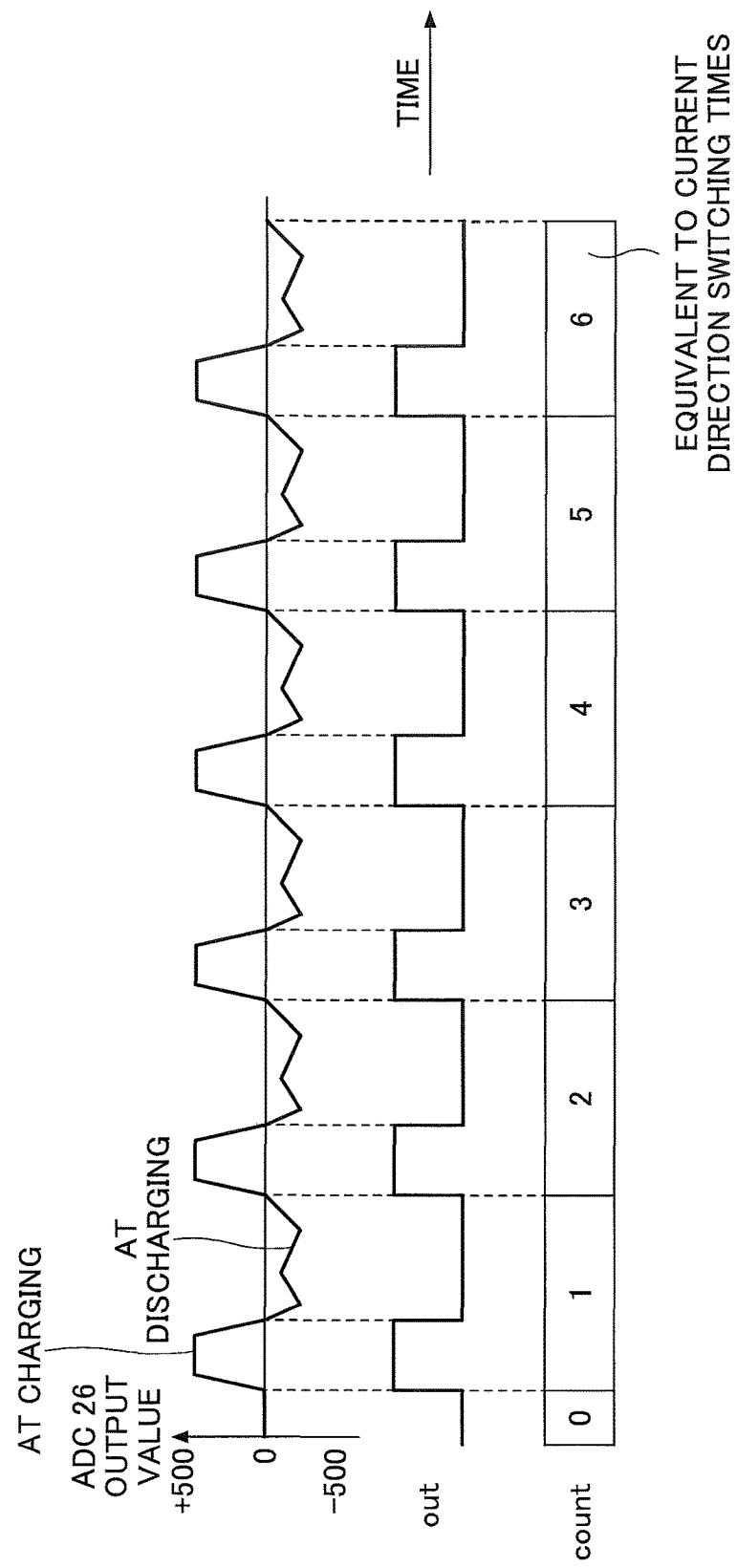
FIG. 35 is a timing chart illustrating an example of an operation of a detector configured to detect the number of switching times of the current directions.

FIG. 34 is a diagram illustrating an example of a configuration of a detector configured to detect the number of switching times of the current directions. FIG. 35 is a timing chart illustrating an example of operations of the detector configured to detect the number of switching times of the current directions. The detector 61 includes a sign determination unit 62 and a counter 63. When the output of the ADC 26 is positive, the sign determination unit 62 sets an out-output to 1, and when the output of the ADC 26 is zero or negative, the sign determination unit 62 sets the out-output to 0. The counter 63 counts up every time the out-output changes from 0 to 1. A count-output of the counter 63 is supplied to the arithmetic-logic unit 28. The count-output is equivalent to the number of switching times of the direction of the current I.

Figure 36:
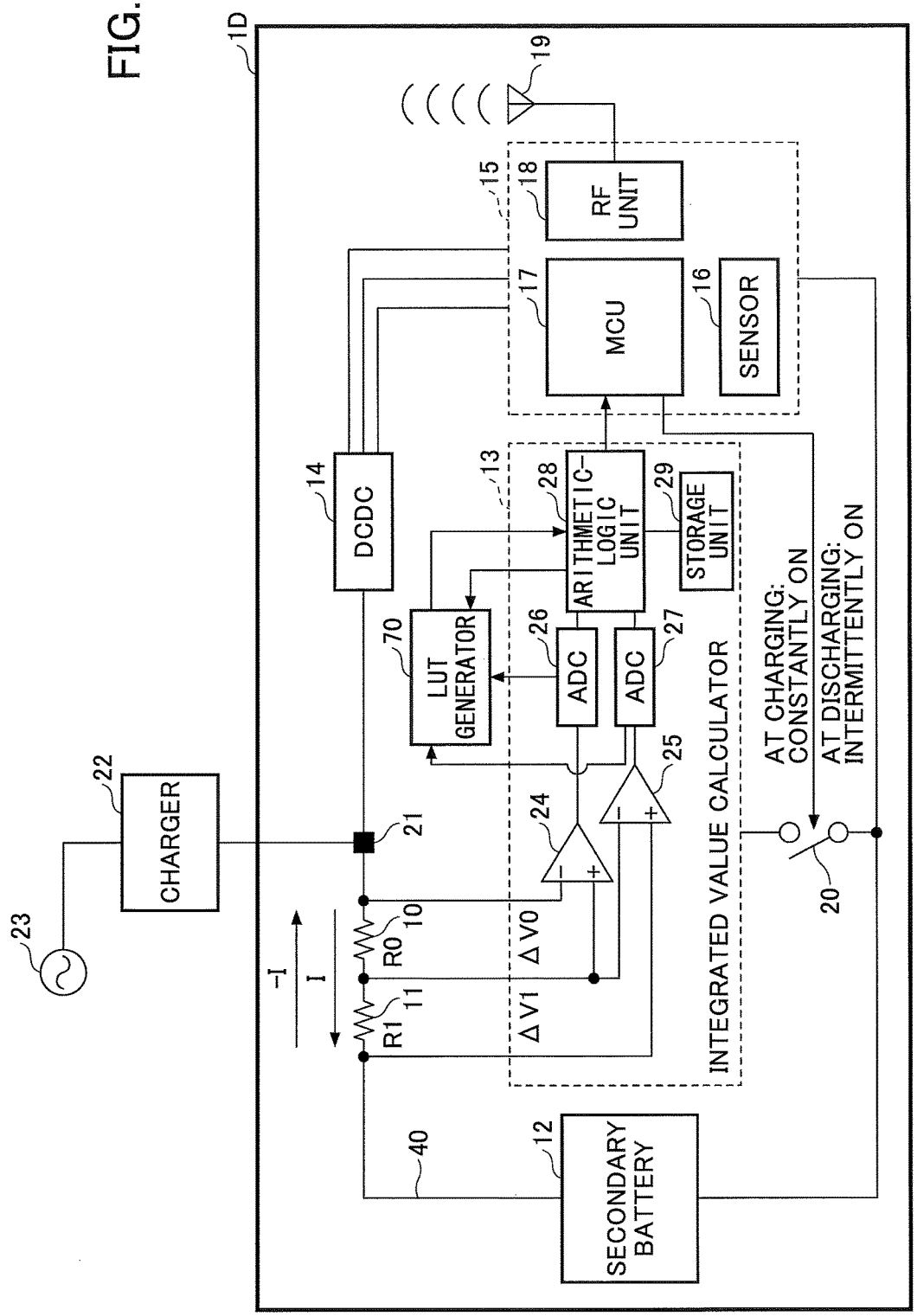
FIG. 36 is a diagram illustrating a fourth specific example of the configuration of the electronic device according to the first embodiment.

FIG. 36 is a diagram illustrating a fourth specific example of the configuration of the electronic device according to the first embodiment. An electronic device 1D illustrated in FIG. 36 is an example of the electronic device 1 illustrated in FIG. 1.

At the time of charging the battery, the MCU 17 constantly keeps on the power supply to the integrated value calculator 13. At the time of charging the battery, the integrated value calculator 13 constantly measures the integrated current value A while constantly measuring the current I (=ΔV0/R0) and time integrating the current I, and constantly measures the resistance value R1 (=ΔV1/I) or the resistance ratio R1/R0 (=ΔV1/ΔV0). The LUT generator 70 stores the constantly measured integrated current value A and the constantly measured resistance value R1 or resistance ratio R1/R0 in the storage unit 29. As a result, the LUT generator 70 is enabled to generate a relational rule such as a lookup table in which the integrated current value A is associated with the resistance value R1, or to generate a relational rule such as a lookup table in which the integrated current value A is associated with the resistance ratio R1/R0.

Figure 37:
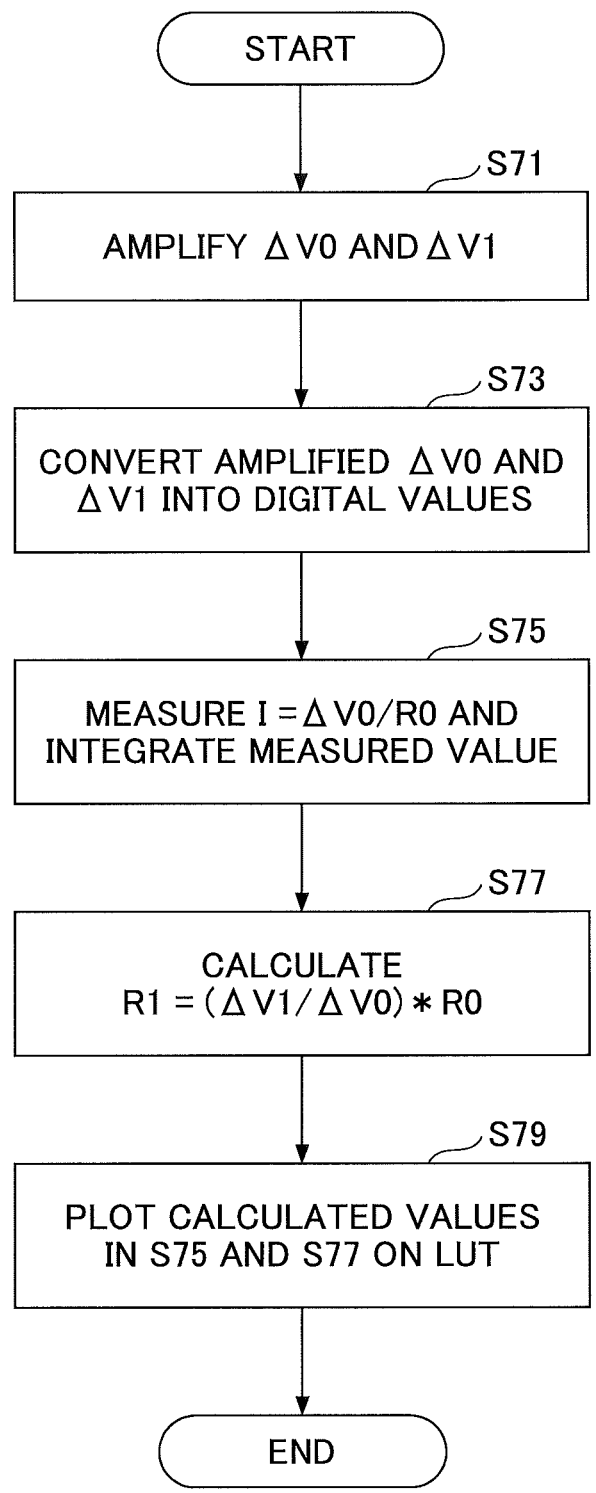
FIG. 37 is a flowchart illustrating an example of the operation of an integrated value calculator according to the fourth specific example of the first embodiment.

FIG. 37 is a flowchart illustrating an operation example at the time of battery charging according to a fourth specific example. FIG. 37 indicates operations of the integrated value calculator 13 at the time of battery charging. The process from the start to the end if the flowchart illustrated in FIG. 37 is repeated until the charging is completed (until the lookup table is completed). The operations at the battery consumption time are similar to those in the embodiment of FIG. 5, and hence a duplicated illustration is omitted from the specification.

In step S71, the integrated value calculator 13 amplifies ΔV1 by the amplifier 25 and amplifies ΔV0 by the amplifier 24. In step S73, the integrated value calculator 13 converts the amplified ΔV0 and ΔV1 into respective digital values in the ADCs 26 and 27. In step S75, the integrated value calculator 13 integrates the measured value of the current I and calculates the integrated current value A up to the present. In step S77, the integrated value calculator 13 calculates the resistance value R1 in the arithmetic-logic unit 28. In step S29, the LUT generator 70 plots the calculated values in steps S75 and S77 on the lookup table (i.e., saves the calculated value in the storage unit 29).

According to the fourth specific example, it is not necessary to acquire data for generating a lookup table in advance through experiments or the like, and it is also possible to automatically compensate for deterioration due to the switching times of the current directions. At the time of charging the battery, the integrated value calculator 13 needs to continuously calculate the integrated current value for generating the lookup table at all times, which increases the current consumption. However, since the charger 22 is attached at the time of charging the battery such that the power is supplied from the outside, the remaining battery level does not decrease. Further, temperature dependency may also be compensated by combining this fourth specific example with the second specific example of FIG. 24.

Figure 38:
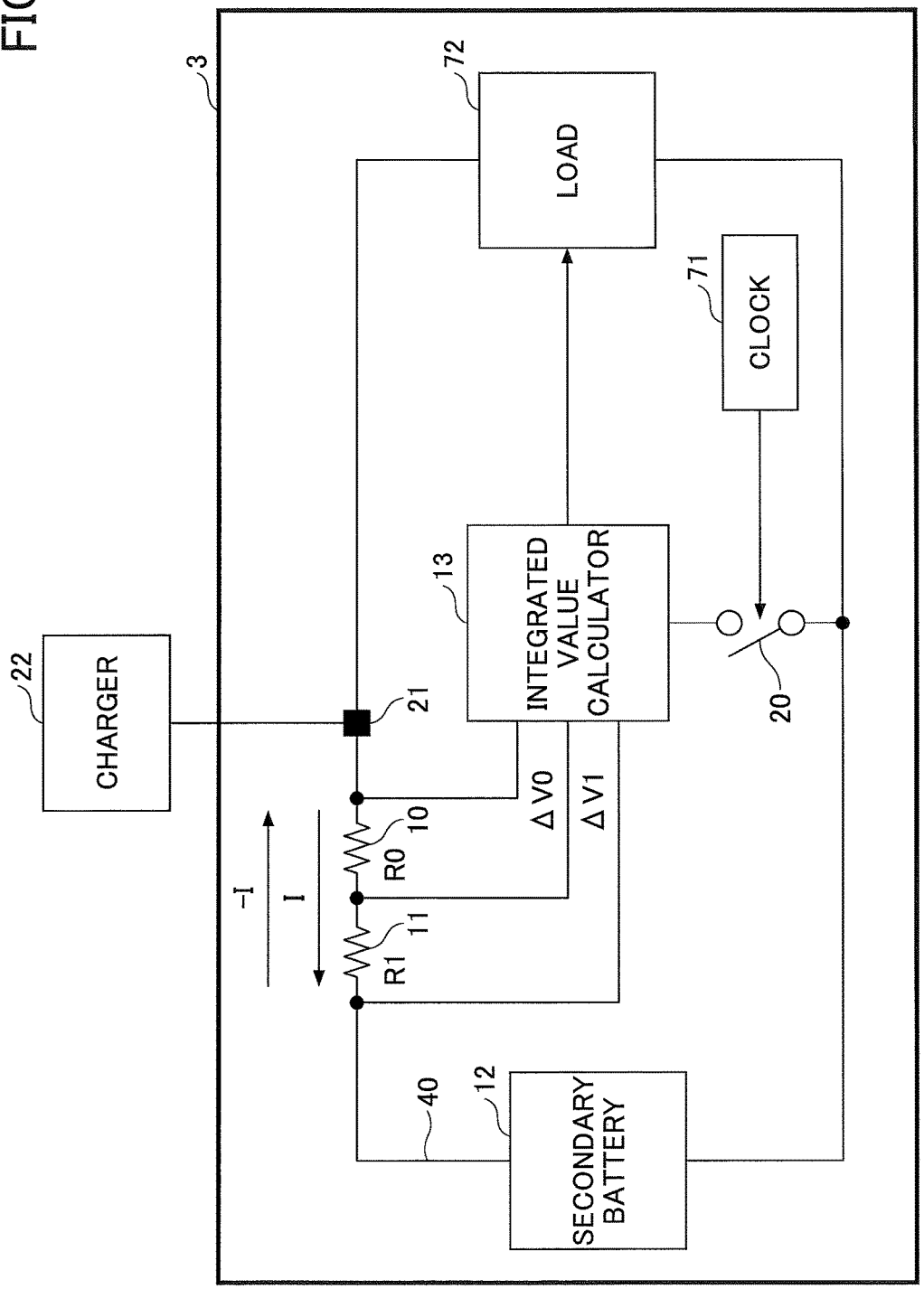
FIG. 38 is a diagram illustrating an example of a configuration of an electronic device according to a third embodiment.

FIG. 38 is a diagram illustrating an example of a configuration of an electronic device according to a third embodiment. The difference from the first embodiment illustrated in FIG. 1 is that a clock 71 periodically operates the integrated value calculator 13 even when no request is received from the signal processor 15 side included in a load 72. The remaining battery level information is not specifically requested depending on IoT devices in some cases; however, even for such cases, it is possible for the remaining battery level information to be indicated. The electronic device according to the third embodiment may be applied to the second embodiment using the primary battery.

According to an embodiment, an electronic device includes a first element having a resistance value that changes in accordance with an integrated value of current flowing in the first element; a second element having a resistance value that changes in accordance with an integrated value of current flowing in the second element, and having a degree of the change in the resistance value that is smaller than that of the change in the resistance value of the first element; an integrated value calculator configured to measure a first voltage generated in the first element and a second voltage generated in the second element and calculate an integrated current value indicating an integrated amount of current flowing through a current path in which the first element and the second element are inserted in series; a battery connected to the current path; and a processor configured to calculate a remaining battery level of the battery based on the integrated current value calculated by the integrated value calculator and perform a predetermined process using the calculated remaining battery level.

According to an embodiment, there is provided an integrated current value measuring method for calculating an integrated current value indicating an integrated amount of current flowing through a current path in which a first element and a second element are inserted in series, where the first element has a resistance value that changes in accordance with an integrated value of current flowing in the first element, the second element has a resistance value that changes in accordance with an integrated value of current flowing in the second element, and has a degree of the change in the resistance value that is smaller than that of the change in the resistance value of the first element. The integrated current value measuring method includes measuring a first voltage generated in the first element and a second voltage generated in the second element; and calculating the integrated current value corresponding to the measured value of the first voltage and the measured value of the second voltage, based on a relation rule between the first voltage, the second voltage, and the integrated current value.

Although the integrated current value measuring device, the remaining battery level measuring device, the electronic device, and the integrated current value measuring method have been described with reference to the above-described embodiments, the present invention is not limited to the above-described embodiments. Various modifications and improvements such as combination or replacement with some or all of the other embodiments may be achieved within the scope of the present invention.

For example, the present invention is not limited to a case of integrating the charging current or the discharging current of the battery, but may include a case of integrating the current flowing in a portion other than the battery. The calculated integrated current value may also be used apart from calculation of the remaining battery level.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority or inferiority of the invention. Although the embodiments of the present invention have been described in detail, it should be understood that the various changes, substitutions, and alterations could be made hereto without departing from the spirit and scope of the invention.

What is claimed is:

1. An integrated current value measuring device comprising:
   a first element having a resistance value that changes in accordance with an integrated value of current flowing in the first element;
   a second element having a resistance value that changes in accordance with an integrated value of current flowing in the second element, and having a degree of the change in the resistance value that is smaller than that of the change in the resistance value of the first element; and an integrated value calculator configured to calculate an integrated current value based on the resistance value of the first element and the resistance value of the second element, the integrated current value being an integrated amount of current flowing in a current path in which the first element and the second element are inserted in series.

2. The integrated current value measuring device as claimed in claim 1, wherein
the integrated value calculator measures a first voltage generated in the first element and a second voltage generated in the second element, and calculates the integrated current value based on the measured value of the first voltage and the measured value of the second voltage.

3. The integrated current value measuring device as claimed in claim 1, wherein
the integrated value calculator
measures a first voltage generated in the first element and a second voltage generated in the second element and calculates the integrated current value based on the measured value of the first voltage and the measured value of the second voltage, and
calculates the integrated current value corresponding to the measured value of the first voltage and the measured value of the second voltage, based on a relation rule between a first voltage generated in the first element, a second voltage generated in the second element, and the integrated current value.

4. The integrated current value measuring device as claimed in claim 1, further comprising:
a cutoff unit configured to cut off power supply to the integrated value calculator in a case where the integrated value calculator does not calculate the integrated current value.

5. The integrated current value measuring device as claimed in claim 1, wherein
the integrated value calculator
measures a first voltage generated in the first element and a second voltage generated in the second element and calculates the integrated current value based on the measured value of the first voltage and the measured value of the second voltage,
calculates a resistance value of the first element using the measured value of the first voltage generated in the first element, the measured value of the second voltage generated in the second element and a resistance value of the second element, and
calculates the integrated current value corresponding to the calculated resistance value of the first element based on a relationship between the integrated current value and the resistance value of the first element.

6. The integrated current value measuring device as claimed in claim 1, wherein
the integrated value calculator
measures the integrated current value and a resistance value of the first element in response to charging a secondary battery connected to the current path, and
generates a relationship between the integrated current value and the resistance value of the first element based on the measured results of the integrated current value and the resistance value of the first element.

7. The integrated current value measuring device as claimed in claim 1, wherein
the integrated value calculator
measures a first voltage generated in the first element and a second voltage generated in the second element and calculates the integrated current value based on the measured value of the first voltage and the measured value of the second voltage,
calculates a ratio of a resistance value of the first element and a resistance value of the second element using the measured value of the first voltage generated in the first element and the measured value of the second voltage generated in the second element, and
calculates the integrated current value corresponding to the calculated ratio based on a relationship between the integrated current value and the ratio.

8. The integrated current value measuring device as claimed in claim 1, wherein
the integrated value calculator
measures the integrated current value and a ratio of a resistance value of the first element and a resistance value of the second element in response to charging a secondary battery connected to the current path, and
generates a relationship between the integrated current value and the ratio based on the measured results of the integrated current value and the ratio.

9. The integrated current value measuring device as claimed in claim 3, further comprising:
a temperature measurement unit configured to measure a temperature, wherein
the integrated value calculator changes the relation rule according to a result of the temperature measured by the temperature measurement unit.

10. The integrated current value measuring device as claimed in claim 3, further comprising:
a switching times detector configured to detect a number of switching times of directions of current flowing through the first element and the second element, wherein
the integrated value calculator changes the relation rule according to a result of the number of switching times detected by the switching times detector.

11. The integrated current value measuring device as claimed in claim 1, wherein
an increase or a decrease of a resistance value of the first element is reversed according to a direction of the current flowing in the first element, and
a connection point, at which a charger for charging a secondary battery connected to the current path is connected to the current path, is located at an opposite side of the secondary battery with respect to insertion portions of the first element and the second element.

12. The integrated current value measuring device as claimed in claim 1, further comprising:
a battery replacement detector configured to detect replacement of the primary battery connected to the current path; and
a current direction inverter configured to invert directions of current flowing through the first element and the second element in a case where the battery replacement detector detects the replacement of the primary battery, wherein
an increase or a decrease of a resistance value of the first element is reversed according to the direction of the current flowing in the first element.

13. The integrated current value measuring device as claimed in claim 1, wherein the integrated value calculator includes
- a first amplifier configured to amplify a first voltage generated in the first element,
- a second amplifier configured to amplify a second voltage generated in the second element,
- a first AD converter to which an output of the first amplifier is inputted, and
- a second AD converter to which an output of the second amplifier is inputted, wherein
- the integrated value calculator calculates a measured value of the first voltage and a measured value of the second voltage based on the output of the first AD converter and the output of the second AD converter.

14. A remaining battery level measuring device comprising:
- a first element having a resistance value that changes in accordance with an integrated value of current flowing in the first element;
- a second element having a resistance value that changes in accordance with an integrated value of current flowing in the second element, and having a degree of the change in the resistance value that is smaller than that of the change in the resistance value of the first element;
- an integrated value calculator configured to measure a first voltage generated in the first element and a second voltage generated in the second element, and calculate an integrated current value indicating an integrated amount of current flowing through a current path in which the first element and the second element are inserted in series; and
- a remaining battery level calculator configured to calculate a remaining battery level of a battery connected to the current path based on the integrated current value calculated by the integrated value calculator, wherein
- the integrated value calculator calculates the integrated current value corresponding to the measured value of the first voltage and the measured value of the second voltage, based on a relation rule between the first voltage, the second voltage, and the integrated current value.

15. An information collecting system comprising:
- a plurality of sensor nodes; and
- an information processing apparatus configured to process information collected from each of the sensor nodes, wherein each of the sensor nodes includes
- a first element having a resistance value that changes in accordance with an integrated value of current flowing in the first element;
- a second element having a resistance value that changes in accordance with an integrated value of current flowing in the second element, and having a degree of the change in the resistance value that is smaller than that of the change in the resistance value of the first element;
- an integrated value calculator configured to calculate an integrated current value based on the resistance value of the first element and the resistance value of the second element, the integrated current value being an integrated amount of current flowing in the current path in which the first element and the second element are inserted in series;
- a battery connected to the current path; and
- a processor configured to calculate remaining battery level data based on the integrated current value calculated by the integrated value calculator, wherein the information processing apparatus manages the respective batteries of the sensor nodes by using the remaining battery level data collected from the sensor nodes.

16. The information collecting system as claimed in claim 15, wherein
the information processing apparatus changes a frequency of collecting information from each of the sensor nodes according to the remaining battery level data collected from a corresponding one of the sensor nodes.

* * * * *